United States Patent
Park et al.

(10) Patent No.: US 7,420,870 B2
(45) Date of Patent: Sep. 2, 2008

(54) PHASE LOCKED LOOP CIRCUIT AND METHOD OF LOCKING A PHASE

(75) Inventors: Moon-Sook Park, Seoul (KR); Kyu-Hyoun Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/430,199

(22) Filed: May 9, 2006

(65) Prior Publication Data
US 2006/0284657 A1    Dec. 21, 2006

(30) Foreign Application Priority Data
Jun. 21, 2005    (KR) .................... 10-2005-0053652

(51) Int. Cl.
*G11C 8/02*    (2006.01)
*H03L 7/06*    (2006.01)

(52) U.S. Cl. ..................... 365/233.1; 327/156
(58) Field of Classification Search ......... 327/147–153, 327/154–163; 375/373–376; 365/233; 331/2, 331/9, 17, 45–57
See application file for complete search history.

(56) References Cited

U.S. PATENT DOCUMENTS

| | | |
|---|---|---|
| 4,380,742 A | 4/1983 | Hart |
| 5,250,914 A | 10/1993 | Kondo |
| 5,592,126 A * | 1/1997 | Boudewijns et al. .......... 331/45 |
| 6,008,680 A * | 12/1999 | Kyles et al. .................. 327/277 |

(Continued)

FOREIGN PATENT DOCUMENTS

JP    8-316802    11/1996

(Continued)

OTHER PUBLICATIONS

Kuo-Hsing Cheng et al. "A Difference Detector PFD for Low Jitter PLL". ICECS 2001. The 8th IEEE International Conference Electronics, Circuits and Systems, 2001. On pp. 43-46 vol. 1 ISBN: 0-7803-7057-0. Meeting Date: Sep. 2-5, 2001.*

(Continued)

*Primary Examiner*—Richard T. Elms
*Assistant Examiner*—Harry W Byrne
(74) *Attorney, Agent, or Firm*—Harness, Dickey & Pierce, P.L.C.

(57) ABSTRACT

A phase locked loop circuit and method of locking a phase. The phased locked loop circuit may include a phase detector receiving an external clock signal and a feedback clock signal and outputting an up signal when a phase of the external clock signal leads a phase of the feedback clock signal and outputting a down signal when the phase of the external clock signal lags the phase of the feedback clock signal, a loop filter circuit increasing a control voltage in response to the up signal and decreasing the control voltage in response to the down signal, and a voltage controlled oscillator circuit receiving the control voltage and directly generating at least n (where n is an integer $\geq 4$) internal clock signals. The phased locked loop circuit may also include a voltage controlled oscillator circuit, including at least four loops, receiving the control voltage and generating multiple internal clock signals.

27 Claims, 28 Drawing Sheets

U.S. PATENT DOCUMENTS

| | | | |
|---|---|---|---|
| 6,075,419 A * | 6/2000 | Sun et al. | 331/57 |
| 6,100,768 A | 8/2000 | Hirayama | |
| 6,137,369 A * | 10/2000 | Kermani | 331/45 |
| 6,181,210 B1 * | 1/2001 | Wakayama | 331/8 |
| 6,304,113 B1 | 10/2001 | Dautriche | |
| 6,329,882 B1 | 12/2001 | Fayneh et al. | |
| 6,456,165 B1 | 9/2002 | Kelkar | |
| 6,504,438 B1 | 1/2003 | Li et al. | |
| 6,570,423 B1 | 5/2003 | Trivedi et al. | |
| 6,611,161 B1 | 8/2003 | Kumar et al. | |
| 6,650,594 B1 | 11/2003 | Lee et al. | |
| 6,815,990 B2 | 11/2004 | Lee | |
| 6,968,356 B1 | 11/2005 | Lakhdir | |
| 2003/0198311 A1 * | 10/2003 | Song et al. | 375/376 |
| 2005/0057316 A1 * | 3/2005 | Kim | 331/57 |

FOREIGN PATENT DOCUMENTS

WO    WO 2004/017518    2/2004

OTHER PUBLICATIONS

Salvatore Levantino, et al., Phase Noise in Digital Frequency Dividers,IEEE Journal of Solid State Circuits vol. 39, No. 5, pp. 775-784.*

Chun-Huat Heng and Bang-Sup Song, A 1.8 GHz CMOS fractional-N frequency synthesizer with randomized multi-phase VCO. This paper appears in: Proceedings of the IEEE 2002 Custom Integrated Circuits Conference. Publication Date: 2002 On pp. 427-430. Meeting Date: May 12-15, 2002.*

Lizhong Sun, Kwasniewski, T., and Iniewski, K., A quadrature output voltage controlled ring oscillator based on three-stage sub-feedback loops, This paper appears in: Proceedings of the 1999 IEEE International Symposium on Circuits and Systems, 1999. ISCAS '99. Publication Date: Jul. 1999, vol. 2, On pp. 176-179 vol. 2.*

German Office Action dated Aug. 3, 2005.

* cited by examiner

PHASE LOCKED LOOP CIRCUIT AND METHOD OF LOCKING A PHASE

PRIORITY STATEMENT

This U.S. non-provisional application claims priority under 35 U.S.C. §119 to Korean Patent Application No. 2005-0053652, filed on Jun. 21, 2005, the entire contents of which are incorporated by reference.

BACKGROUND OF THE INVENTION

FIG. 1A illustrates a conventional phase locked loop, which may include a phase frequency detector (PFD) 10, a charge pump (CP) 12, a loop filter (LF) 14, a voltage controlled oscillator (VCO) 16, one or more dividers 18-1, 18-2, and/or one or more dividers 20.

The phase frequency detector (PFD) 10 may receive an external clock signal ECLK and generate an UP or DN signal in response to a phase difference between the external clock signal ECLK and a feedback clock signal DCLK. When the phase of the external input signal ECLK leads that of the feedback clock signal DCLK, the UP signal is activated. When the phase of ECLK lags that of DCLK, the DN signal is activated.

The charge pump (CP) 12 and/or the loop filter (LF) 14 may increase the level of a control voltage (Vc), in response to the activated UP signal and may decrease the level of the control voltage Vc, in response to the activated DN signal.

For example, when the frequency of ECLK is 1 GHz, in order to acquire one or more final internal clocks of 2 GHz frequency, a conventional voltage controlled oscillator (VCO) 16 may generate two clock signals CLK and CLKB, each with a frequency of 4 GHz. The divider 18-1 may divide the clock signal CLK to generate two clock signals ICLK0, ICLK180, each with a frequency of 2 GHz. The divider 18-2 may divide the inverted clock signal CLKB to generate two clock signals ICLK90, ICLK270, each with a frequency of 2 GHz.

The divider 20 may receive one of the clock signals ICLK0, ICLK180, ICLK90 and ICLK270 and output the divided clock signal DCLK, with a frequency of 1 GHz, which equals the frequency of ECLK.

That is, in order to acquire final internal clock signals ICLK0, ICLK180, ICLK90 and ICLK270 having a higher frequency than that of ECLK, the divider 20 is necessary. In other words, when a PLL does not include the divider 20, the frequencies of the final internal clocks ICLK0~ICLK270 are equal to the frequency of external input clock ECLK. However, the frequency of each of CLK and CLKB must be four times higher than that of ECLK to generate final internal clocks ICLK0~ICLK270, with a frequency twice that of ECLK.

As a result, a problem with conventional phase locked loops is that higher frequency internal clock signals (for example, 4 GHz or higher) may be difficult to generate from a VCO when a power voltage (VCC) is low (for example, less than 2VDD or under 1.8V). Further, conventional phase locked loops may have a larger chip area as a result of the number of dividers.

FIG. 1B illustrates another conventional phase locked loop. The conventional phase locked loop of FIG. 1B includes some of the same elements as that of FIG. 1A. In addition to one or more dividers 18-1, 18-2, and one or more dividers 20, the conventional phase locked loop of FIG. 1B may further include one or more dividers 18-3, 184, 18-5, and 18-6. As shown, the frequency of each of CLK and CLKB is eight times higher than that of ECLK while the frequency of each of iCLK0~iCLK270 is four times higher than that of ECLK. Further, the frequency of each of ICLK0~ICLK315 is two times higher than that of ECLK.

As an example, if the frequency of ECLK is 1 GHz, the frequency of CLK and CLKB is 8 GHz, the frequency of iCLK0~iCLK270 is 4 GHz, and the frequency of ICLK0~ICLK315 is 2 GHz. Under low power supply voltage conditions (for example, less than 2VDD), a conventional VCO 16 cannot generate the output clocks CLK and CLKB with a frequency of 8 GHz.

FIG. 2 illustrates a conventional voltage controlled oscillator, for example, VCO 16 of FIGS. 1A or 1B. The conventional voltage controlled oscillator may include a first ring oscillator 16-1 including one or more inverters I1, I2, I3, formed in a loop configuration, a second ring oscillator 16-2 including one or more inverters I4, I5, I6, formed in a loop configuration (for example, the same configuration as the first ring oscillator 16-1) and a latch circuit 16-3 including one or more inverters I7, I8, for latching CLK and CLKB.

The frequency of the output clock CLK/CLKB may be controlled in response of the level of Vc. When the level of Vc is increased, the frequency of the output clock CLK/CLKB may be increased. When the level of Vc is decreased, the frequency of the output clock CLK/CLKB may be decreased. A problem may be that the Vc is at too low a level (if supplied by a low power supply) so that high frequency output clock signals CLK/CLKB (for example, 4 GHz or more) can not be generated.

FIG. 3A is a timing diagram illustrating example operation of a conventional phase locked loop, for example, the conventional phase locked loop of FIG. 1A.

The voltage controlled oscillator 16 may generate two clock signals CLK and CLKB, having a phase difference of 180°, and which have a frequency four times higher frequency than that of ECLK. The frequency of each of ICLK0~ICLK270 may be two times higher than that of ECLK.

FIG. 3A illustrates that an internal clock ICLK0 is locked with the external clock ECLK. When a power supply voltage is a higher level, all of the above internal clock signals may be generated normally. However, when a power supply voltage is a lower level, it is impossible to generate the timing diagram of FIG. 3A.

FIG. 3B is a timing diagram illustrating example operation of a conventional phase locked loop, for example, the conventional phase locked loop of FIG. 1B.

The voltage controlled oscillator 16 may generate two clock signals CLK and CLKB having a phase difference of 180°, and which have a frequency eight times higher than that of ECLK. The frequency of each of iCLK0~iCLK270 may be four times higher than that of ECLK. The frequency of each of ICLK0~ICLK315 may be two times higher than that of ECLK.

FIG. 3B illustrates that an internal clock ICLK0 is locked with the external clock ECLK. When a power supply voltage is a higher level, all of the above internal clock signals may be generated normally. However, as set forth above, when a power supply voltage is a lower level, it is impossible to generate the timing diagram of FIG. 3B.

SUMMARY OF THE INVENTION

Example embodiments of the present invention are directed to phase locked loop circuits and methods of locking the phase of a signal.

Example embodiments of the present invention are directed to phase locked loop circuits and methods of locking the phase of a feedback clock signal to an external clock signal.

Example embodiments of the present invention are directed to memory devices and methods of writing data to and reading data from a memory cell array.

Example embodiments of the present invention are directed to memory systems and methods of writing data to and reading data from a memory, including a plurality of memory devices.

Example embodiments of the present invention are directed to phase locked loop circuits and methods of locking the phase of a feedback clock signal to an external clock signal, which directly generate at least n (where n is an integer ≧4) internal clock signals.

Example embodiments of the present invention are directed to memory devices and methods of writing data to and reading data from a memory cell array, which directly generate at least n (where n is an integer ≧4) internal clock signals.

Example embodiments of the present invention are directed to memory systems and methods of writing data to and reading data from a memory, including a plurality of memory devices, which directly generate at least n (where n is an integer ≧4) internal clock signals.

Example embodiments of the present invention are directed to phase locked loop circuits and methods of locking the phase of a feedback clock signal to an external clock signal, which include at least four loops and generate multiple internal clock signals.

Example embodiments of the present invention are directed to memory devices and methods of writing data to and reading data from a memory cell array, which include at least four loops and generate multiple internal clock signals.

Example embodiments of the present invention are directed to memory systems and methods of writing data to and reading data from a memory, including a plurality of memory devices, which include at least four loops and generate multiple internal clock signals.

Example embodiments of the present invention are directed to phase locked loop circuits, memory devices, and memory systems, which include a voltage controlled oscillator circuit including a hyper ring oscillator.

Example embodiments of the present invention are directed to phase locked loop circuits, memory devices, and memory systems, in which a voltage controlled oscillator circuit includes one or more loop circuits.

Example embodiments of the present invention are directed to phase locked loop circuits, memory devices, and memory systems, which include a reduced number or no dividers.

Example embodiments of the present invention are directed to phase locked loop circuits, memory devices, and memory systems, which have a reduce chip areas because fewer dividers or no dividers are needed.

Example embodiments of the present invention are directed to phase locked loop circuits, methods of locking the phase of a feedback clock signal to an external clock signal, memory devices, methods of writing data to and reading data from a memory cell array, memory systems, and methods of writing data to and reading data from a memory, including a plurality of memory devices which may generate higher frequency internal clock signals (for example, 2 GHz or more) even though a power supply voltage VDD is relatively low (for example, less than 2V).

In an example embodiment of the present invention, a phase locked loop circuit may include a phase detector receiving an external clock signal and a feedback clock signal and outputting an up signal when a phase of the external clock signal leads a phase of the feedback clock signal and outputting a down signal when the phase of the external clock signal lags the phase of the feedback clock signal, a loop filter circuit increasing a control voltage in response to the up signal and decreasing the control voltage in response to the down signal, and a voltage controlled oscillator circuit receiving the control voltage and directly generating at least n (where n is an integer ≧4) internal clock signals.

In another example embodiment of the present invention, the voltage controlled oscillator circuit includes a hyper ring oscillator.

In another example embodiment of the present invention, the loop filter circuit is a low pass filter.

In another example embodiment of the present invention, the loop filter circuit is a digital loop filter circuit.

In another example embodiment of the present invention, the loop filter circuit is an analog loop filter circuit.

In another example embodiment of the present invention, the voltage controlled oscillator circuit does not include a divider.

In an example embodiment of the present invention, a method of locking the phase of a feedback clock signal to an external clock signal includes receiving the external clock signal and the feedback clock signal, outputting an up signal when a phase of the external clock signal leads a phase of the feedback clock signal and outputting a down signal when the phase of the external clock signal lags the phase of the feedback clock signal, increasing a control voltage in response to the up signal and decreasing the control voltage in response to the down signal, and directly generating at least n (where n is an integer ≧4) internal clock signals, and generating the feedback clock signal from at least one of the n internal clock signals.

In an example embodiment of the present invention, a phase locked loop circuit includes a phase detector receiving an external clock signal and a feedback clock signal and outputting an up signal when a phase of the external clock signal leads a phase of the feedback clock signal and outputting a down signal when the phase of the external clock signal lags the phase of the feedback clock signal, a loop filter circuit increasing a control voltage in response to the up signal and decreasing the control voltage in response to the down signal, and a voltage controlled oscillator circuit, including at least four loops, receiving the control voltage and generating multiple internal clock signals.

In an example embodiment of the present invention, a method of locking the phase of a feedback clock signal to an external clock signal includes receiving the external clock signal and the feedback clock signal, outputting an up signal when a phase of the external clock signal leads a phase of the feedback clock signal and outputting a down signal when the phase of the external clock signal lags the phase of the feedback clock signal, increasing a control voltage in response to the up signal and decreasing the control voltage in response to the down signal, and generating at least n (where n is an integer ≧4) internal clock signals, each from a separate loop.

In an example embodiment of the present invention, a memory device includes a memory cell array, a phase locked loop circuit receiving an external clock signal and a feedback clock signal and directly generating at least n (where n is an integer ≧4) internal clock signals, a control signal generator circuit for receiving the at least n internal clock signals and generating p control signals (where p is an integer ≧3), at least one serial to parallel converter, for receiving a serial bit stream bits and converting the serial bit stream into a parallel bit stream that can be written to the memory cell array, in response to each of the p control signals, and at least one parallel to serial converter, for receiving a parallel bit stream from the memory cell array and converting the parallel bit stream into a serial bit stream, in response to each of the p control signals.

In an example embodiment of the present invention, a method of writing data to and reading data from a memory cell array includes receiving an external clock signal and a feedback clock signal, directly generating at least n (where n is an integer $\geqq 4$) internal clock signals in response to the external clock signal and the feedback clock signal, generating p control signals (where p is an integer $\geqq 3$) in response to the at least n internal clock signals, receiving a serial bit stream and converting the serial bit stream into a parallel bit stream that can be written to the memory cell array, in response to each of the p control signals, and receiving a parallel bit stream from the memory cell array and converting the parallel bit stream into a serial bit stream, in response to each of the p control signals.

In an example embodiment of the present invention, a memory system includes a memory including a plurality of memory devices, each memory device including a memory cell array, each memory device including a phase locked loop circuit receiving an external clock signal and a feedback clock signal and directly generating at least n (where n is an integer $\geqq 4$) internal clock signals, a control signal generator circuit for receiving the at least n internal clock signals and generating p control signals (where p is an integer $\geqq 3$), at least one serial to parallel converter, for receiving a serial bit stream of m (where m is an integer $\geqq 1$) bits and converting the serial bit stream of m bits into a parallel bit stream that can be written to the memory cell array, in response to each of the p control signals, and at least one parallel to serial converter, for receiving a parallel bit stream from the memory cell array and converting the parallel bit stream into a serial bit stream, in response to each of the p control signals and a memory controller supplying the external clock signal to the phased locked loop of each of the plurality of memory devices so each of the phased locked loops may generate the at least n internal clock signals provided to the control signal generator circuit and supplying a command signal and an address signal to read the parallel bit stream from any of the plurality of memory devices and write the serial bit stream to any of the plurality of memory devices.

In an example embodiment of the present invention, a method of writing data to and reading data from a memory, including a plurality of memory devices includes supplying an external clock signal to each of the plurality of memory devices, directly generating at least n (where n is an integer $\geqq 4$) internal clock signals from the external clock signal, generating p control signals (where p is an integer $\geqq 3$) in response to the at least n internal clock signals, receiving a serial bit stream and converting the serial bit stream into a parallel bit stream that can be written to any of the plurality of memory devices, in response to each of the p control signals, supplying a write command signal and an address signal to write the parallel bit stream to at least one of the plurality of memory devices, supplying a read command signal and an address signal to read a parallel bit stream from at least one of the plurality of memory devices, and receiving the parallel bit stream from any of the plurality of memory devices and converting the parallel bit stream into a serial bit stream, in response to each of the p control signals.

BRIEF DESCRIPTION OF THE DRAWINGS

The present invention will become more fully understood from the detailed description of example embodiments provided below and the accompanying drawings, which are given for purposes of illustration only, and thus do not limit the invention.

Figure 1A:
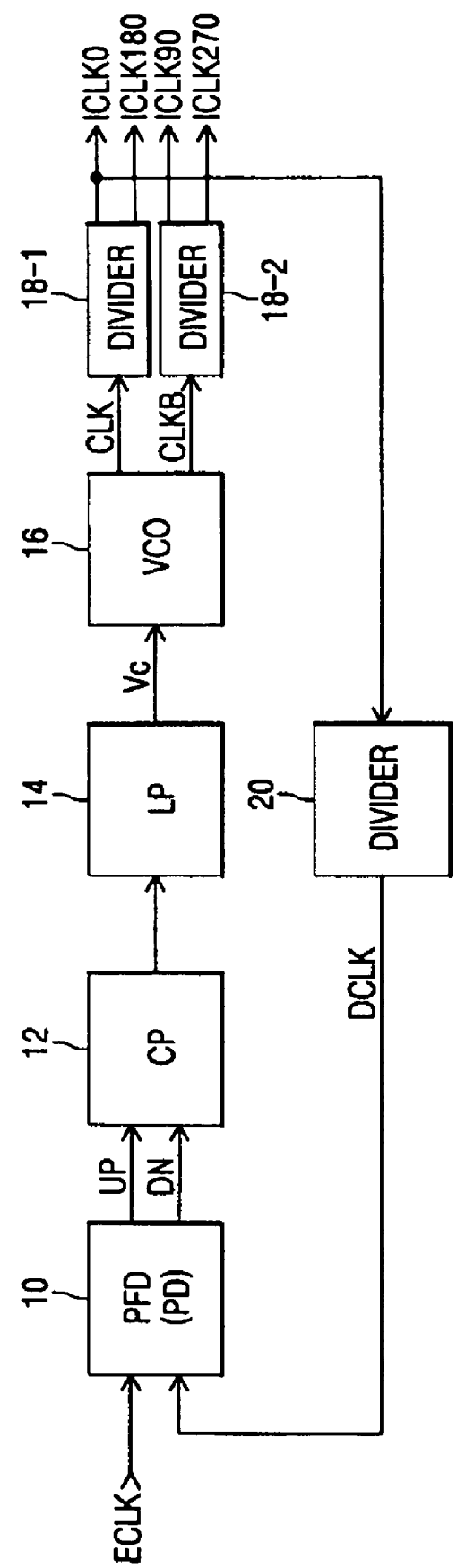
FIG. 1A illustrates a conventional phase locked loop.
Figure 1B:
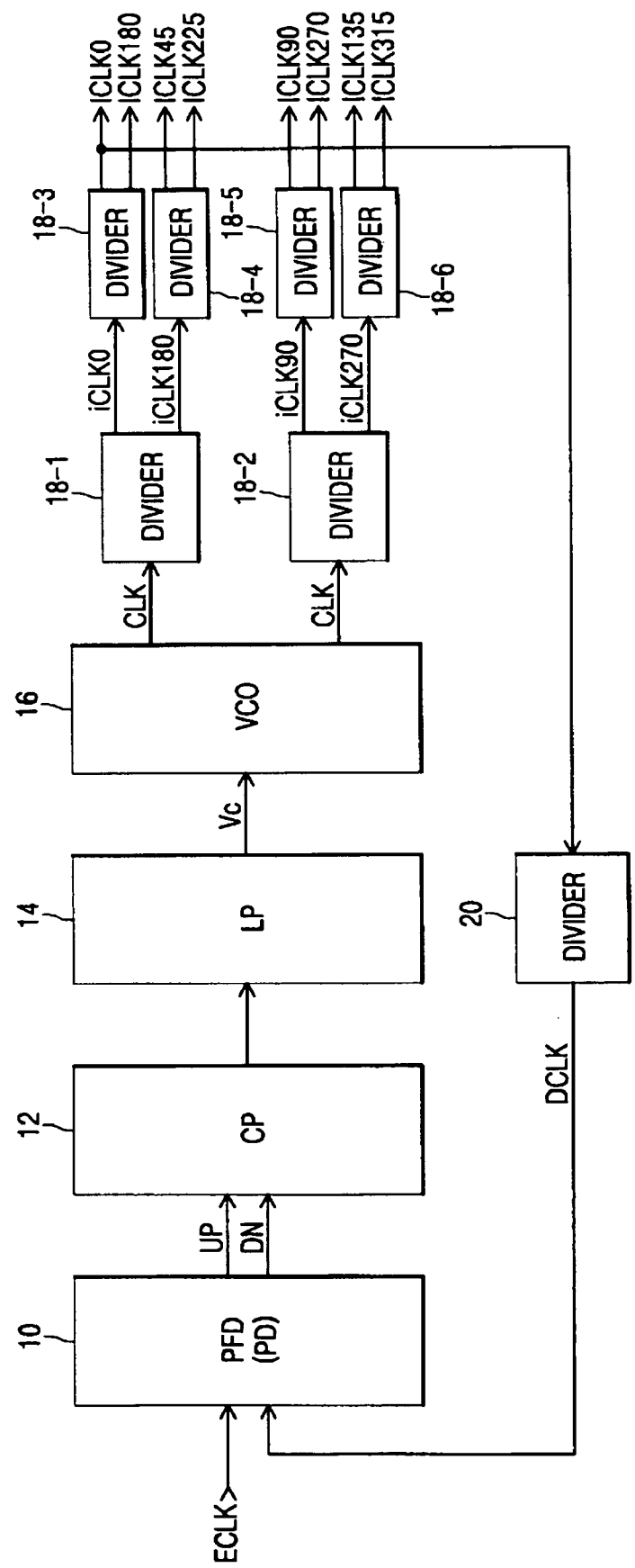
FIG. 1B illustrates another conventional phase locked loop.
Figure 2:
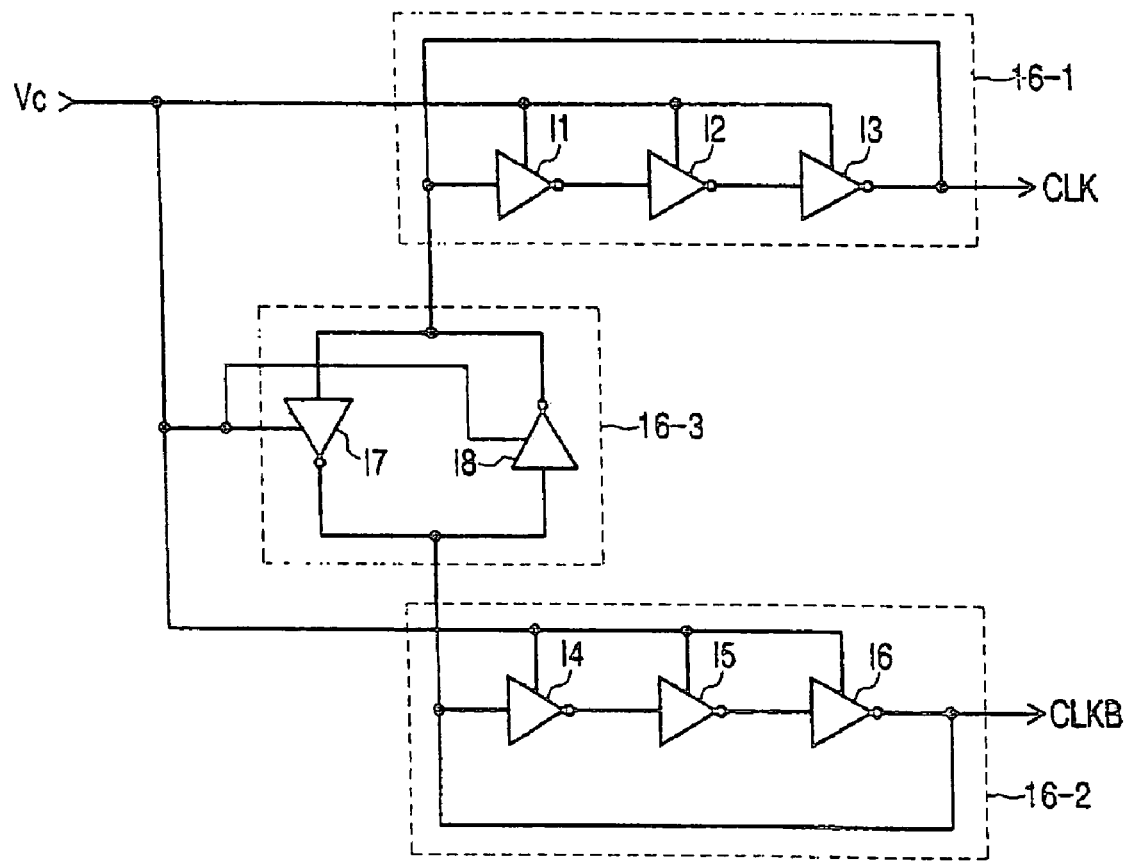
FIG. 2 illustrates a conventional voltage controlled oscillator.
Figure 3A:
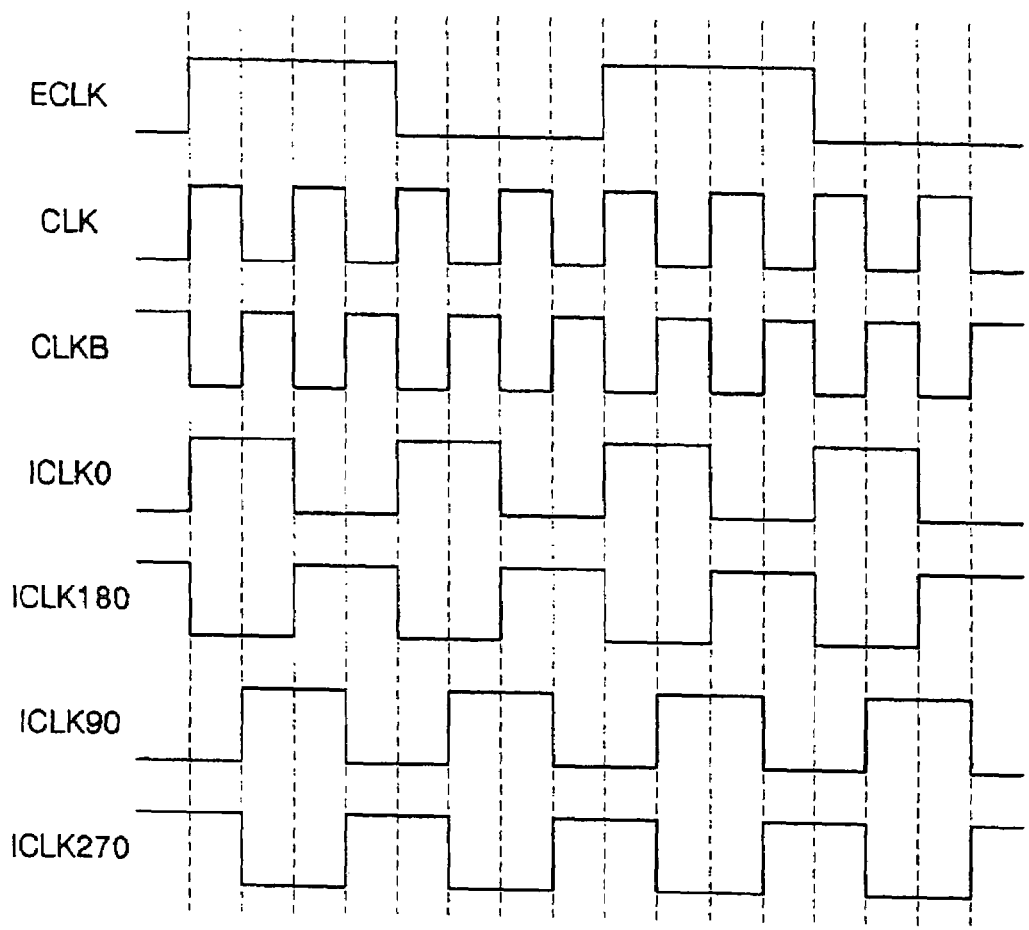
FIG. 3A is a timing diagram illustrating example operation of a conventional phase locked loop.
Figure 3B:
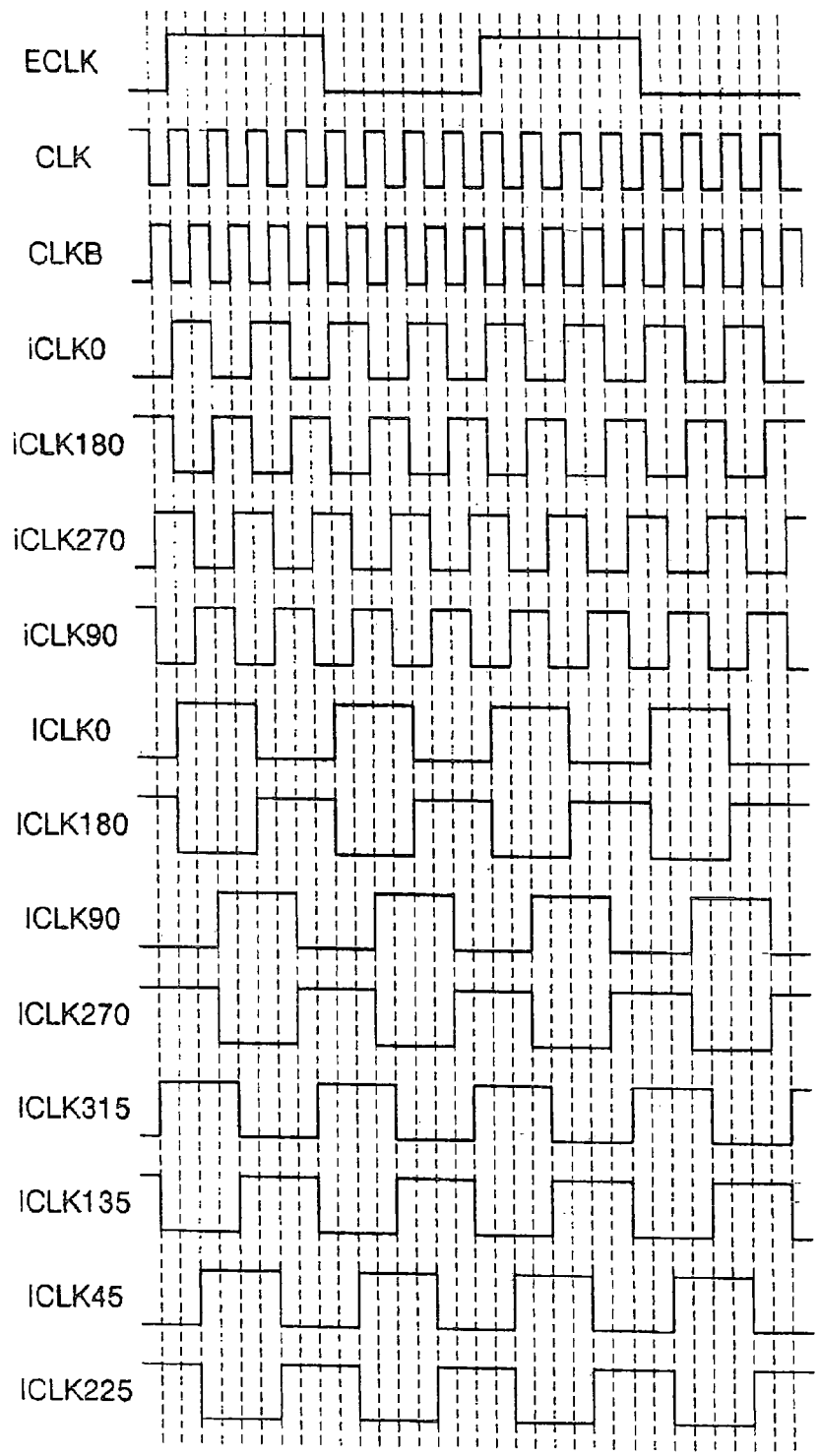
FIG. 3B is a timing diagram illustrating example operation of another conventional phase locked loop.

It should be noted that these Figures are intended to illustrate the general characteristics of methods and devices of example embodiments of this invention, for the purpose of the description of such example embodiments herein. These drawings are not, however, to scale and may not precisely reflect the characteristics of any example embodiment, and should not be interpreted as defining or limiting the range of values or properties of example embodiments within the scope of this invention.

DETAILED DESCRIPTION OF EXAMPLE EMBODIMENTS

Various example embodiments of the present invention will now be described more fully with reference to the accompanying drawings in which some example embodiments of the invention are shown.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. or numbers 1, 2, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the description. For example, two functions/acts described in succession may in fact be executed substantially concurrently or may sometimes be executed in the reverse order, depending upon the functionality/acts involved.

Figure 4:
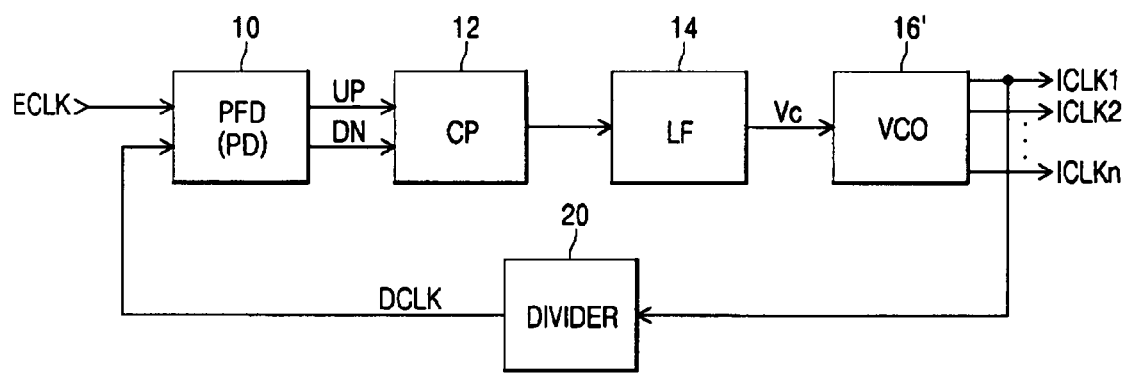
FIG. 4 illustrates a phase locked loop in accordance with an example embodiment of the present invention.

FIG. 4 illustrates a phase locked loop in accordance with an example embodiment of the present invention, which may include a phase frequency detector (PFD) 10, a charge pump (CP) 12, a loop filter (LF) 14, a voltage controlled oscillator (VCO) 16', and/or one or more dividers 20. The VCO 16' may directly generate a plurality of higher frequency internal clock signals ICLK1~ICLKn (for example, 2 GHz or more) corresponding to internal clock signals ICLK0~ICLK270 of FIG. 1A even though a power supply voltage VDD is relatively low (for example, less than 2V). In an example embodiment, the VCO 16' may be implemented with a hyper ring oscillator, which may generate directly a plurality of internal clock signals (for example, four clock signals or more) which have a regular phase difference. In addition, a VCO in accordance with an example embodiment of the present invention, for example VCO 16', may have a reduced chip area because dividers, for example, dividers 18-1, 18-2, and/or 20 are not needed.

Figure 5A:
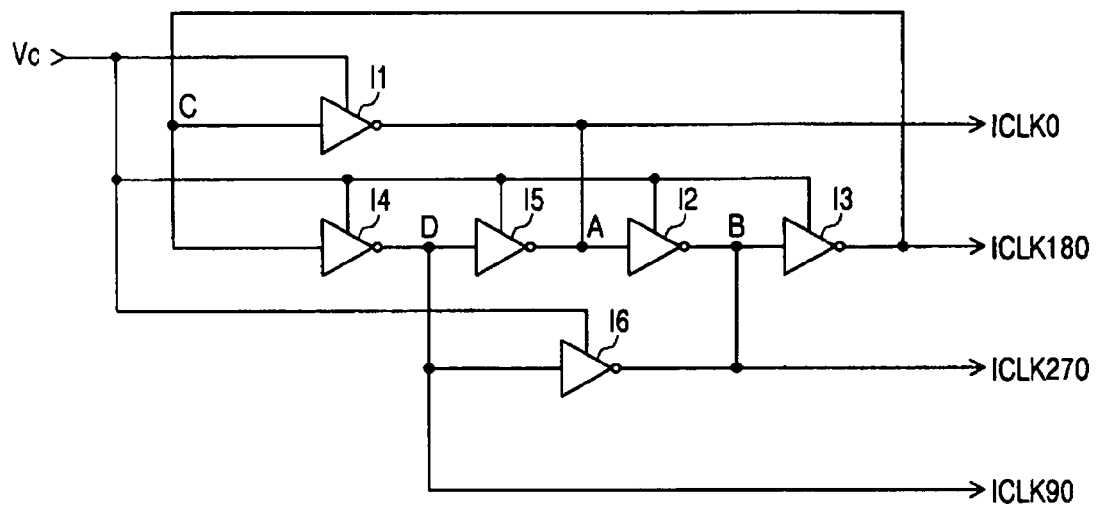
FIG. 5A illustrates a voltage controlled oscillator in accordance with an example embodiment of the present invention.

FIG. 5A illustrates a voltage controlled oscillator in accordance with an example embodiment of the present invention, which includes a plurality of inverters I1 to I6. In an example embodiment, a first loop circuit includes inverters I4, I5, I2 and I3, a second loop circuit includes inverters I1, I2 and I3, and a third loop circuit includes inverters I4, I6 and I3. Clock ICLK0 may be generated by a phase combination of clock signals generated from I1 and I5. Each clock signal ICLK90, ICLK180, ICLK270 may similarly be generated by a principle, such as phase combination. In an example embodiment, the phase of node D may lead the phase of node A by 90°. The phase of node C may lead the phase of node D by 90°. The phases of each node may be determined similarly so that the nodes are evenly spaced.

Figure 5B:
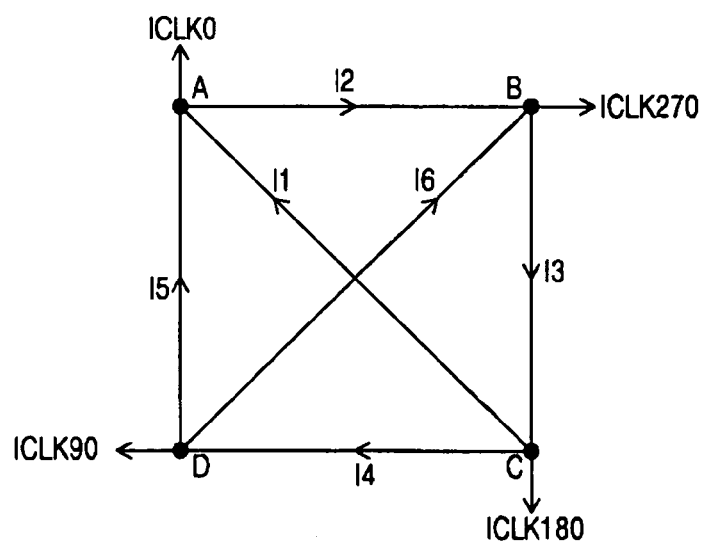
FIG. 5B is an example equivalent diagram of the voltage controlled oscillator of FIG. 5A.

FIG. 5B is an equivalent diagram of the voltage controlled oscillator of FIG. 5A, illustrating the plurality of inverters I1 to I6 and clocks ICLK0, ICLK90, ICLK180, and ICLK270. In the example embodiment of FIGS. 5A and 5B, each of nodes A and B receives two inputs (I1, I5/I2, I6) and outputs one output (I2/I3) while each of nodes C and D receive one input (I3/I4) and outputs two outputs (I1, I4/I5, I6).

Figure 6A:
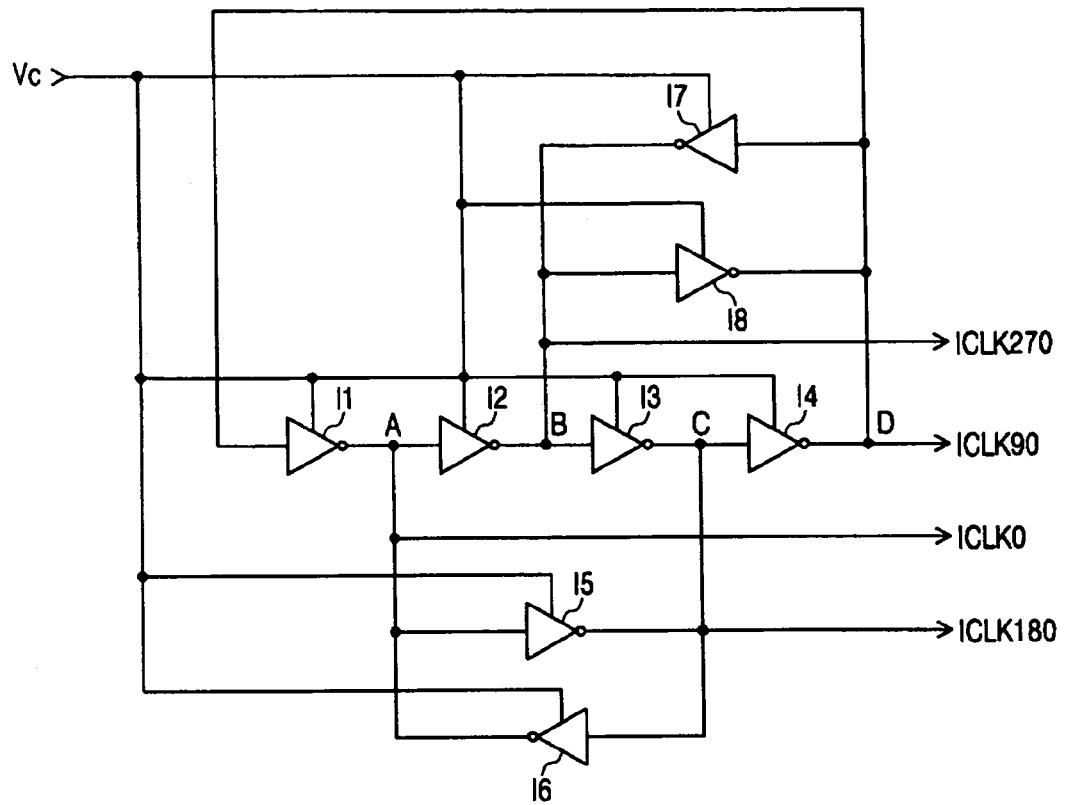
FIG. 6A illustrates a voltage controlled oscillator in accordance with another example embodiment of the present invention.

FIG. 6A illustrates a voltage controlled oscillator in accordance with an example embodiment of the present invention, which includes a plurality of inverters I1 to I8. In an example embodiment, a first loop circuit includes inverters I1, I2, I3 and I4, a second loop circuit includes inverters I1, I2 and I8, a third loop circuit includes inverters I3, I4 and I7, a fourth loop circuit includes inverters I2, I3 and I6, a fifth loop circuit includes inverters I7 and I8, a sixth loop circuit includes inverters I5 and I6 and a seventh loop circuit includes inverters I1, I5 and I4.

Figure 6B:
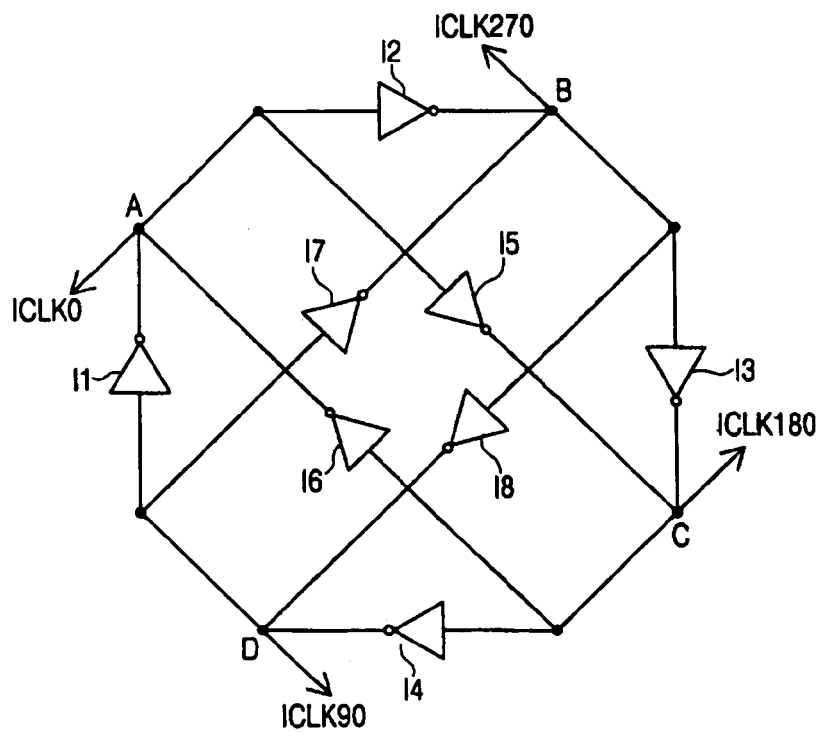
FIG. 6B is another illustration of the voltage controlled oscillator of FIG. 6A.
Figure 6C:
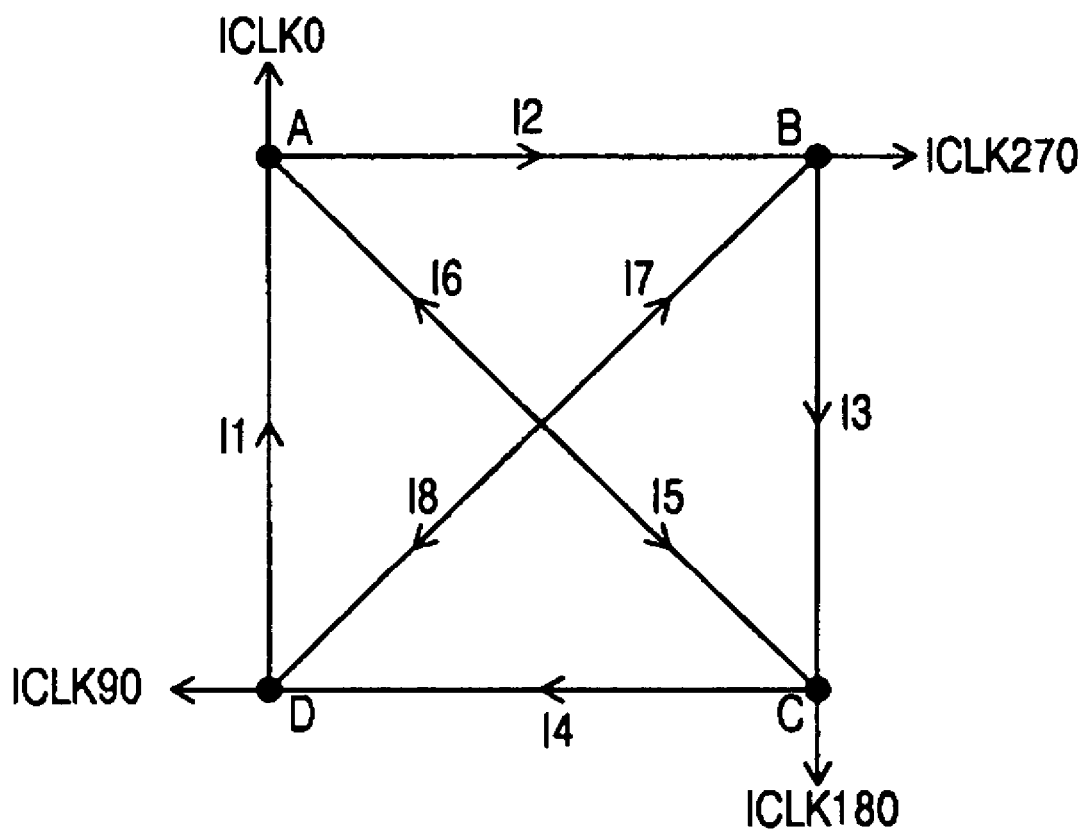
FIG. 6C is an example equivalent diagram of the voltage controlled oscillator of FIG. 6A.

FIG. 6B is an alternative to FIG. 6A and FIG. 6C is equivalent diagrams of the voltage controlled oscillator of FIG. 6A, illustrating the plurality of inverters I1 to I8 and clocks ICLK0, ICLK90, ICLK180, and ICLK270. In the example embodiment of FIGS. 6A and 6B, each of nodes A, B, C, and D receives two inputs (I1, I6/I2, I7/I3, I5/I4, I8) and outputs one output (I2/I3/I4/I1).

Figure 7:
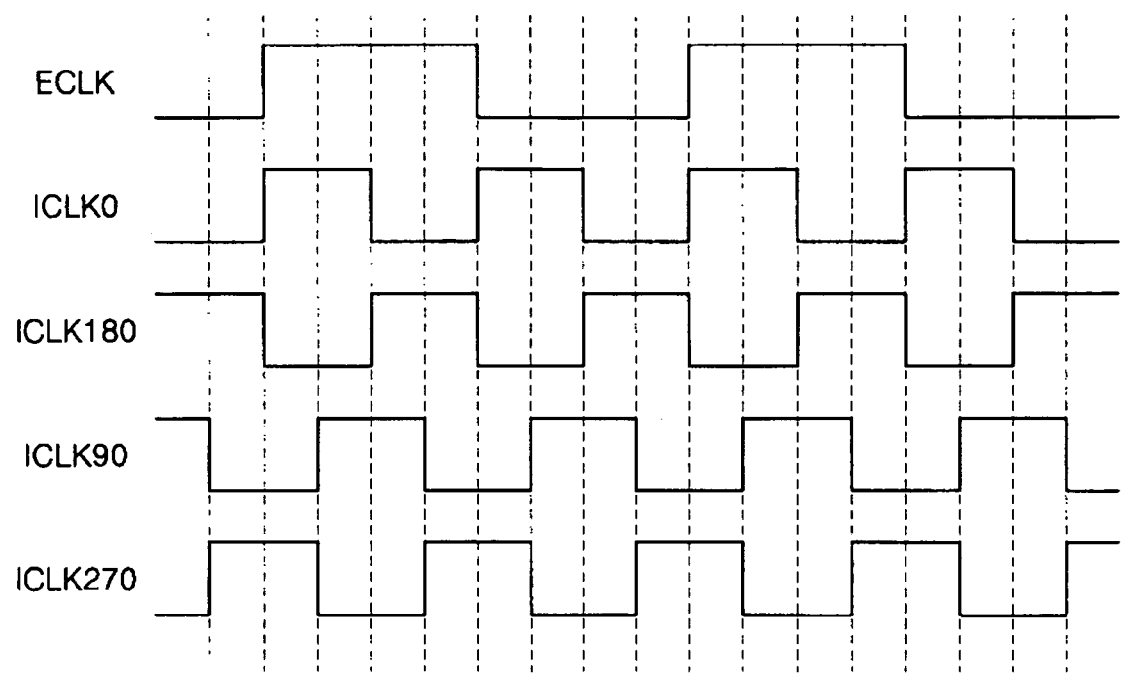
FIG. 7 is a timing diagram illustrating operation of the phase locked loop of FIG. 6A in accordance with an example embodiment of the present invention.

FIG. 7 is a timing diagram illustrating operation of the phase locked loop of FIG. 6A in accordance with an example embodiment of the present invention. As illustrated, a frequency of all internal clock signals ICLK0~ICLK270 is two times higher than that of the external clock signal ECLK. As a result, the phase locked loop of FIG. 6A may generate a plurality of internal clock signals (for example, four or more) of high frequency (for example, 2 GHz or more) corresponding to internal clock signals ICLK0~ICLK270 of FIG. 1A without using dividers, even if the power supply voltage VDD is lower (for example, less than 2V).

Figure 8A:
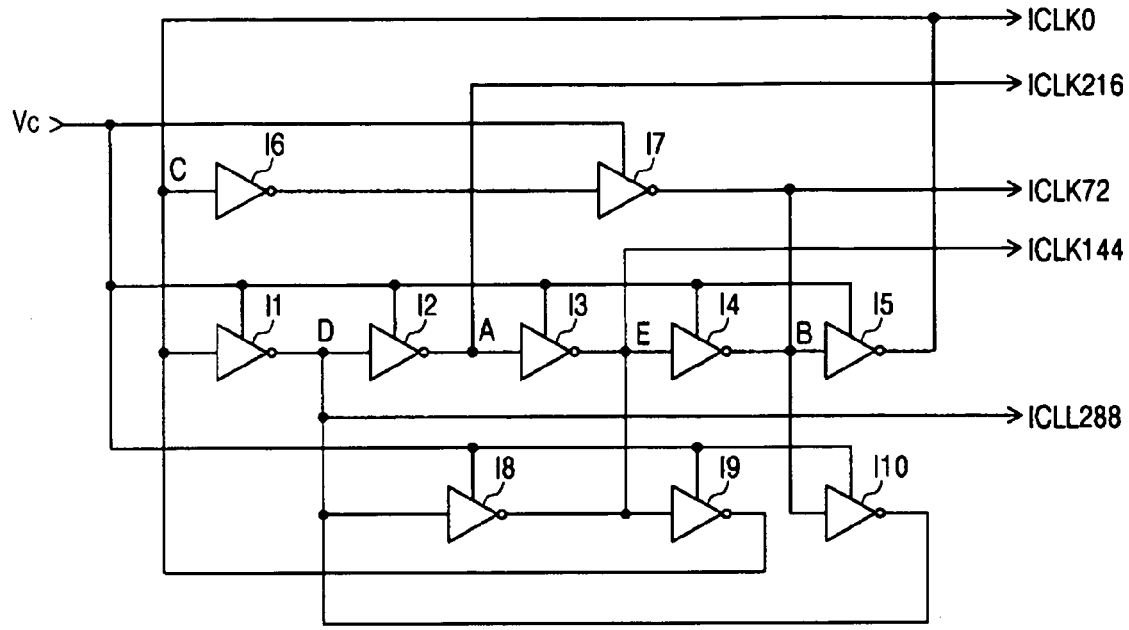
FIG. 8A illustrates a voltage controlled oscillator in accordance with another example embodiment of the present invention.

FIG. 8A illustrates a voltage controlled oscillator in accordance with another example embodiment of the present invention, which includes a plurality of inverters I1 to I10. Clock signals ICLK0, ICLK72, ICLK144, ICLK216, and ICLK288 may be generated by a principle, such as phase combination. In an example embodiment, the phases of nodes A-E may differ by 72°.

Figure 8B:
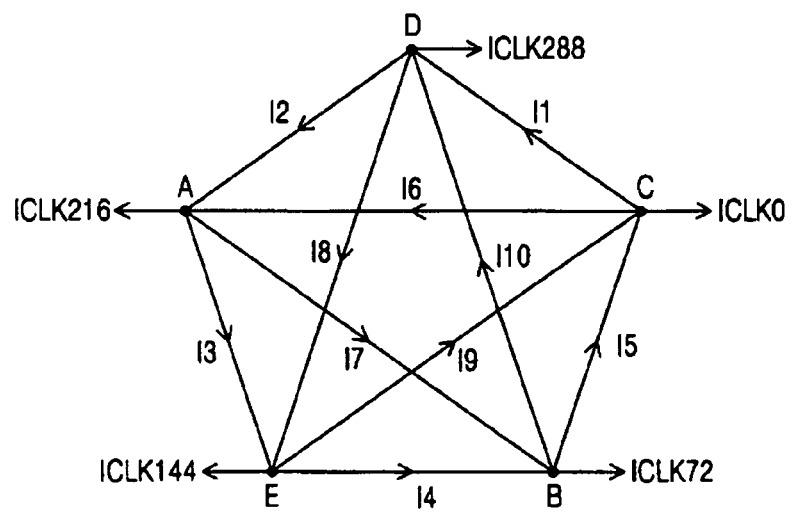
FIG. 8B is an example equivalent diagram of the voltage controlled oscillator of FIG. 8A.

FIG. 8B is an example equivalent diagram of the voltage controlled oscillator of FIG. 8A, illustrating the plurality of inverters I1 to I10 and Clock signals ICLK0, ICLK72, ICLK144, ICLK216, and ICLK288. In the example embodiment of FIGS. 8A and 8B, each of nodes A-E receives two inputs (I2, I6/I1, I10/I5, I9/I4, I7/I3, I8) and outputs two outputs (I3, I7/I2, I6/I1, I6/I5, I10/I4, I9).

Figure 9:
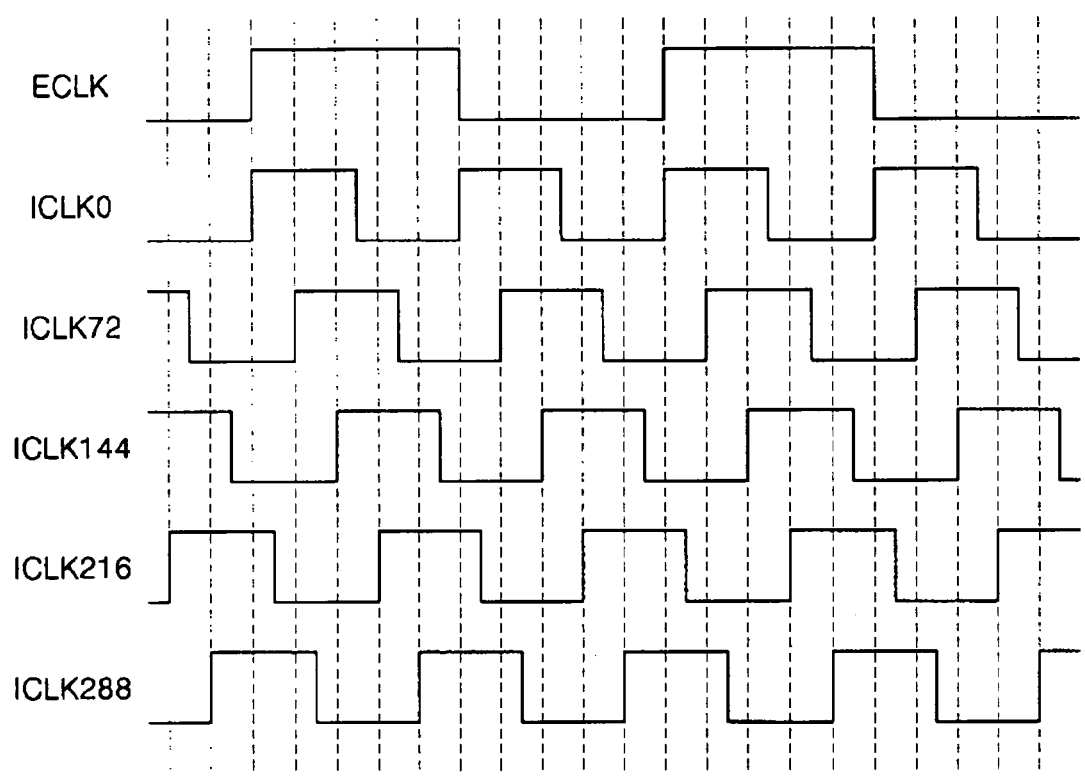
FIG. 9 is a timing diagram illustrating operation of the voltage controlled oscillator of FIG. 8A in accordance with an example embodiment of the present invention.

FIG. 9 is a timing diagram illustrating operation of the phase locked loop of FIG. 8A in accordance with an example embodiment of the present invention. As illustrated, a frequency of all five internal clock signals ICLK0, ICLK72, ICLK144, ICLK216, and ICLK288 is twice that of the external clock signal ECLK. As a result, the phase locked loop of FIG. 8A may generate a plurality of internal clock signals (for example, four or more) of high frequency (for example, 2 GHz or more) without using dividers, even if the power supply voltage VDD is lower (for example, less than 2V).

Figure 10:
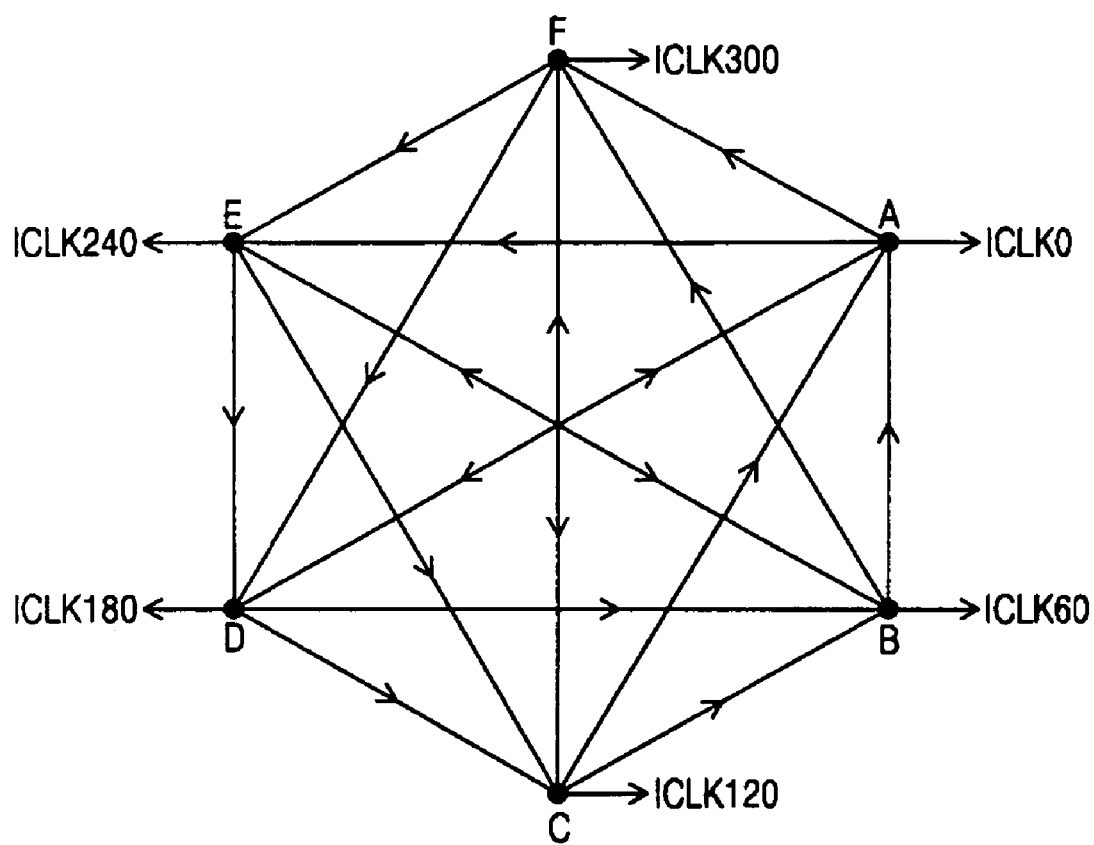
FIG. 10 is an example equivalent diagram of a voltage controlled oscillator in accordance with another example embodiment of the present invention.

FIG. 10 is an example equivalent diagram of a voltage controlled oscillator in accordance with another example embodiment of the present invention, illustrating a plurality of inverters, nodes A-F, and clock signals ICLK0, ICLK60, ICLK120, ICLK180, ICLK240, and ICLK300. In an example embodiment, the phases of nodes A-F may differ by 60°. In the example embodiment of FIG. 10, each of nodes A-F receives three inputs and outputs two outputs.

Figure 11:
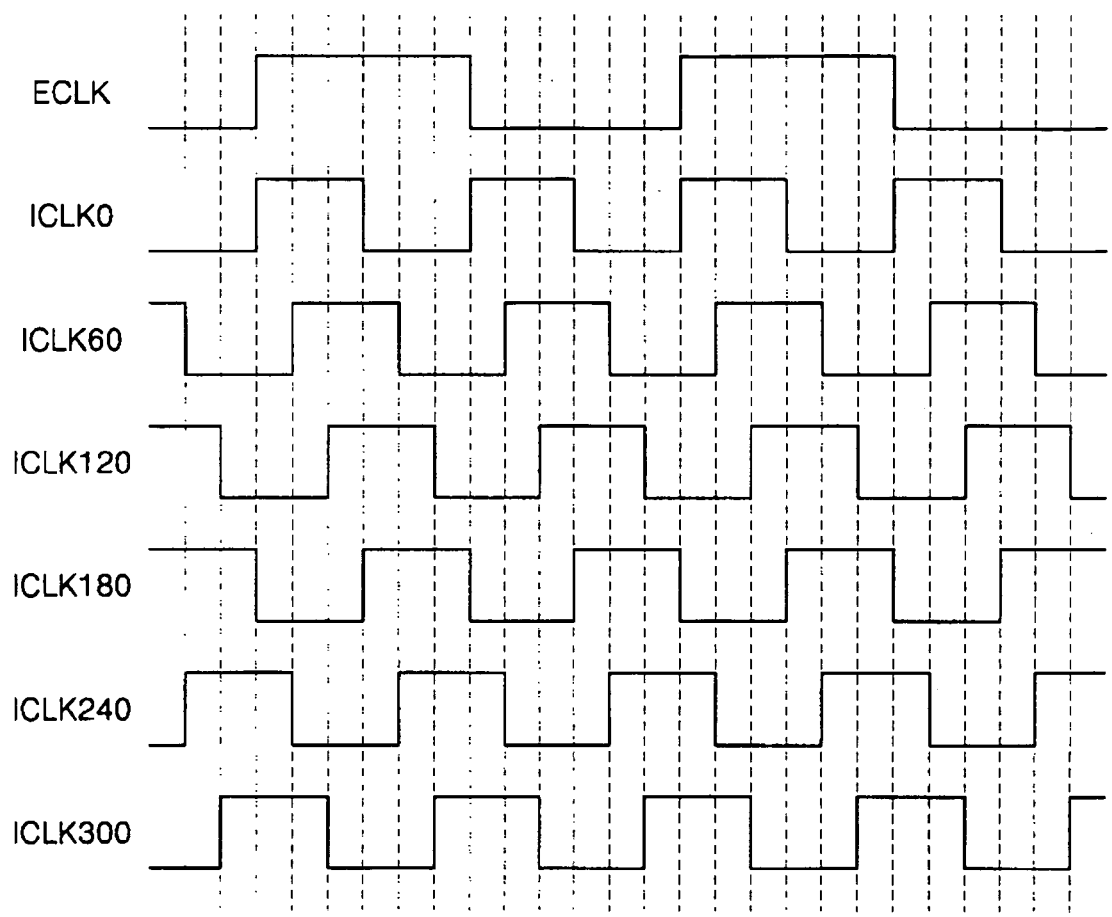
FIG. 11 is a timing diagram illustrating operation of the voltage controlled oscillator of FIG. 10 in accordance with an example embodiment of the present invention.

FIG. 11 is a timing diagram illustrating operation of the voltage controlled oscillator of FIG. 10 in accordance with an example embodiment of the present invention. Clock signals ICLK0, ICLK60, ICLK120, ICLK180, ICLK240, and ICLK300 may be generated by a principle, such as phase combination. As illustrated, a frequency of six internal clock signals ICLK0, ICLK60, ICLK120, ICLK180, ICLK240, and ICLK300 is twice that of the external clock signal ECLK. As a result, the voltage controlled oscillator of FIG. 10 may generate a plurality of internal clock signals (for example, four or more) of high frequency (for example, 2 GHz or more) without using dividers, even if the power supply voltage VDD is lower (for example, less than 2V).

Figure 12:
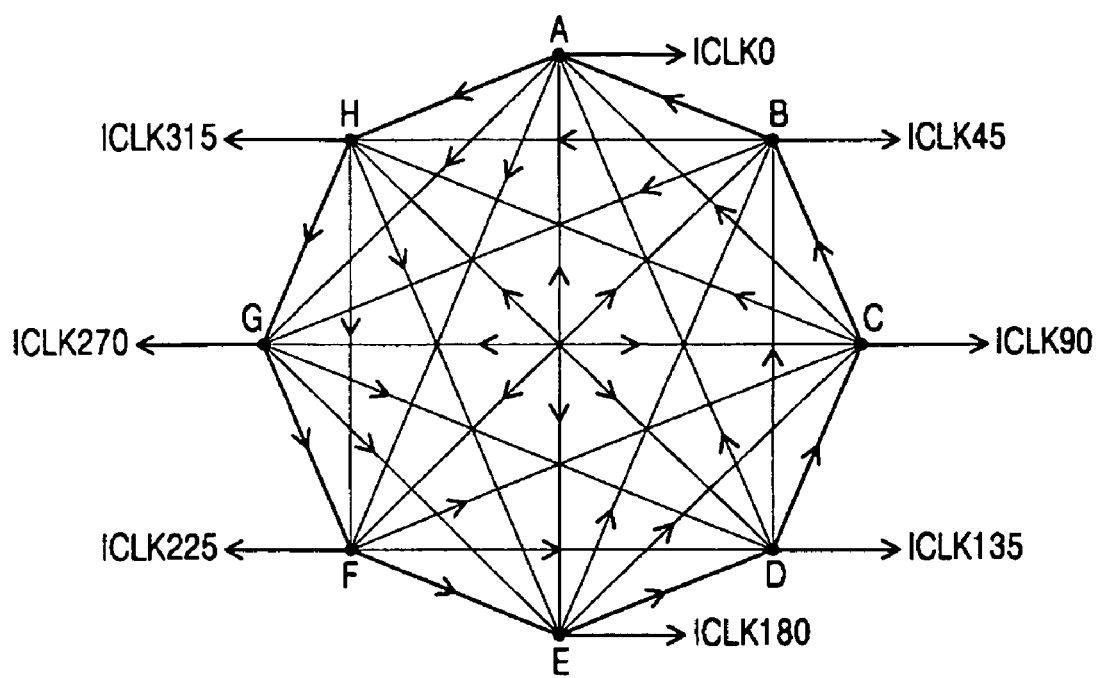
FIG. 12 is an example equivalent diagram of a voltage controlled oscillator in accordance with another example embodiment of the present invention.

FIG. 12 is an example equivalent diagram of a voltage controlled oscillator in accordance with another example embodiment of the present invention, illustrating a plurality of inverters, nodes A-H, and clock signals ICLK0, ICLK45, ICLK90, ICLK135 ICLK180, ICLK225, ICLK270, and ICLK315. In an example embodiment, the phases of nodes A-F may differ by 45°. In the example embodiment of FIG. 12, each of nodes A-H receives four inputs and outputs three outputs.

Figure 13:
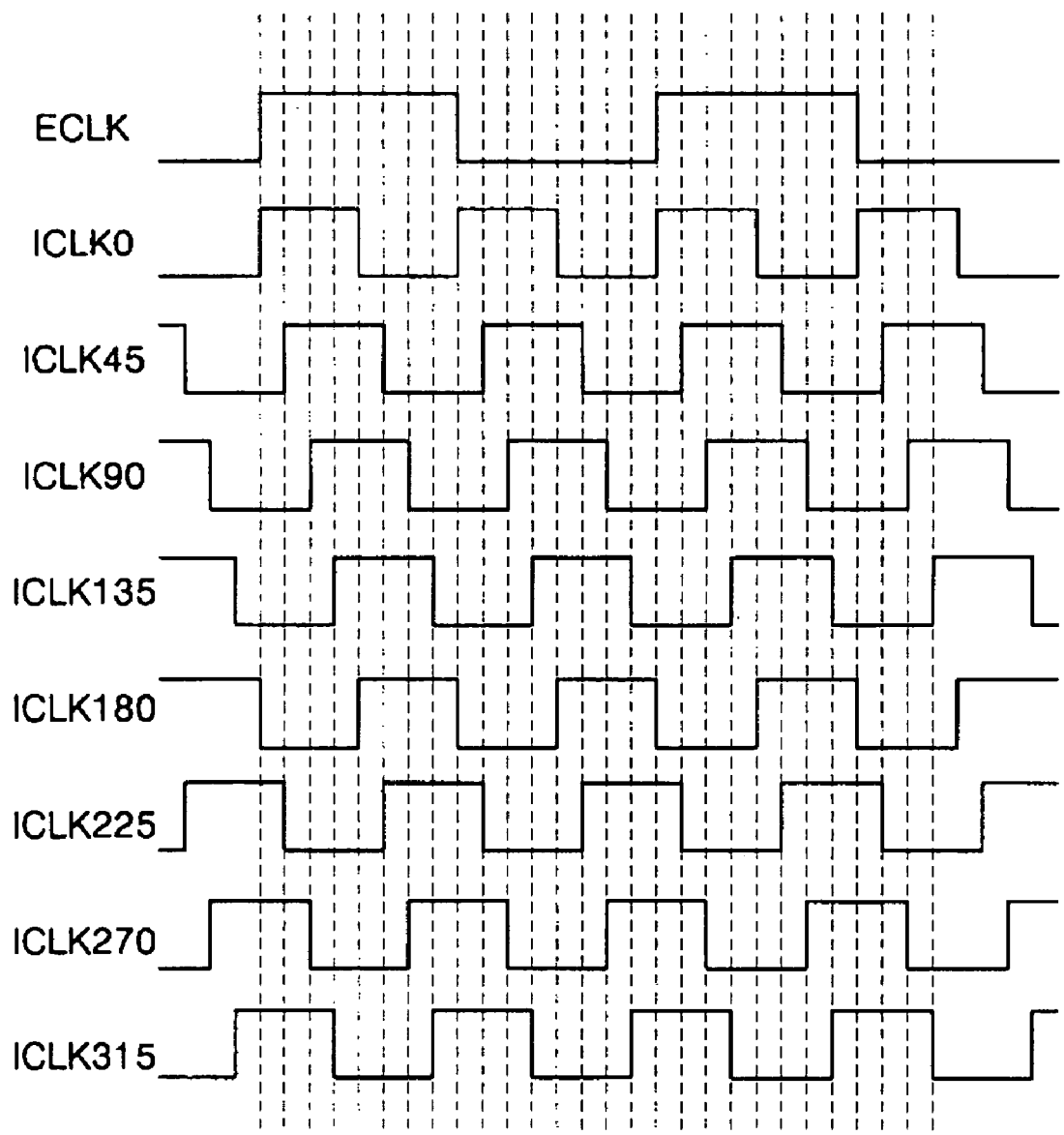
FIG. 13 is a timing diagram illustrating operation of the voltage controlled oscillator of FIG. 12 in accordance with an example embodiment of the present invention.

FIG. 13 is a timing diagram illustrating operation of the voltage controlled oscillator of FIG. 12 in accordance with an example embodiment of the present invention. Clock signals ICLK0, ICLK45, ICLK90, ICLK135 ICLK180, ICLK225, ICLK270, and ICLK315 may be generated by a principle, such as phase combination. As illustrated, a frequency of eight internal clock signals ICLK0, ICLK45, ICLK90, ICLK135 ICLK180, ICLK225, ICLK270, and ICLK315 is twice that of the external clock signal ECLK. As a result, the voltage controlled oscillator of FIG. 12 may generate a plurality of internal clock signals (for example, four or more) of high frequency (for example, 2 GHz or more) without using dividers, even if the power supply voltage VDD is lower (for example, less than 2V).

As illustrated in FIGS. 4-13, a VCO, and hence a phase locked loop in accordance with example embodiments of the present invention may generate n internal clock signals, where n is any integer. As described above, the internal clock signals may be generated by any technique, for example, phase combination. Further, the internal clock signals may be evenly distributed, as outlined above, or unevenly distributed, if desired.

As set forth above, in an example embodiment of the present invention, a phase locked loop circuit may include a voltage controlled oscillator circuit which receive a control voltage and directly generates at least n (where n is an integer ≧4) internal clock signals. In other example embodiments of the present invention, the voltage controlled oscillator circuit includes a hyper ring oscillator.

In other example embodiments of the present invention, the voltage controlled oscillator circuit generates n internal clock signals, wherein a frequency of the n internal clock signals is a multiple of a frequency of the external clock signal and wherein at least one of the n internal clock signals is used to generate a feedback clock signal. In other example embodiments of the present invention, the multiple is four, eight, or 16.

In example embodiments of the present invention, the loop filter circuit is a low pass filter.

In other example embodiment of the present invention, the voltage controlled oscillator circuit which generates the n internal clock signals includes n nodes and generates at least two of the n internal clock signals by phase combination.

In other example embodiments of the present invention, when n=4, two nodes of the voltage controlled oscillator circuit receives (n/2) inputs and two nodes of the voltage controlled oscillator circuit receives (n/2)−1 input. In other example embodiments of the present invention, when n is an even number greater than four, each node of the voltage controlled oscillator circuit receives (n/2) inputs. In other example embodiments of the present invention, when n is an odd number greater than four, each node of the voltage controlled oscillator circuit receives (n−1)/2 inputs. In other example embodiments of the present invention, when n is an even number greater than four, the hyper ring oscillator includes n*((n/2) inverters. In other example embodiments of the present invention, when n is an odd number greater than four, the hyper ring oscillator includes n*((n−1)/2) inverters.

In example embodiment of the present invention, a phase of each of the n nodes differs by 360/n.

In an example embodiment of the present invention, when n=4, the hyper ring oscillator includes four nodes, six inverters, and at least three loop circuits or 4 nodes, eight inverters, and at least seven loop circuits.

In another example embodiment of the present invention, when n=5, the hyper ring oscillator includes 5 nodes, ten inverters, and at least eight loop circuits.

In another example embodiment of the present invention, when n=6, the hyper ring oscillator includes six nodes, 18 inverters, and at least eight loop circuits.

In another example embodiment of the present invention, when n=8, the hyper ring oscillator includes 8 nodes, 32 inverters, and at least eight loop circuits.

In another example embodiment of the present invention, the control voltage is less than or equal to two volts, for example, 1.8 volts.

In another example embodiment of the present invention, at least one of the n internal clock signals is locked with the external clock signal.

In another example embodiment of the present invention, the voltage controlled oscillator circuit generates m*n internal clock signals (where m is an integer ≧2), a frequency of the m*n internal clock signals is a multiple of a frequency of the external clock signal and wherein at least one of the m*n internal clock signals is used to generate the feedback clock signal. In another example embodiment of the present invention, the multiple is four, eight, or 16.

In another example embodiment of the present invention, the voltage controlled oscillator circuit further includes a voltage controlled oscillator receiving the control voltage and generating n intermediate internal clock signals and n dividers, dividing the n intermediate internal clock signals into the m*n internal clock signals.

In another example embodiment of the present invention, a frequency of the m*n internal clock signals is a multiple of a frequency of the external clock signal, a frequency of the n intermediate internal clock signals is a multiple of the frequency of the external clock signal, and a frequency of the n intermediate internal clock signals is a multiple of the frequency of the m*n internal clock signals.

In another example embodiment of the present invention, the voltage controlled oscillator circuit does not include a divider.

In an example embodiment of the present invention, a phase locked loop circuit includes a voltage controlled oscillator circuit, including at least four loops, receiving a control voltage and generating multiple internal clock signals.

In an example embodiment of the present invention, a phase locked loop circuit includes a voltage controlled oscillator circuit which generates at least n (where n is an integer ≧4) internal clock signals, each from a separate loop.

Figure 14A:
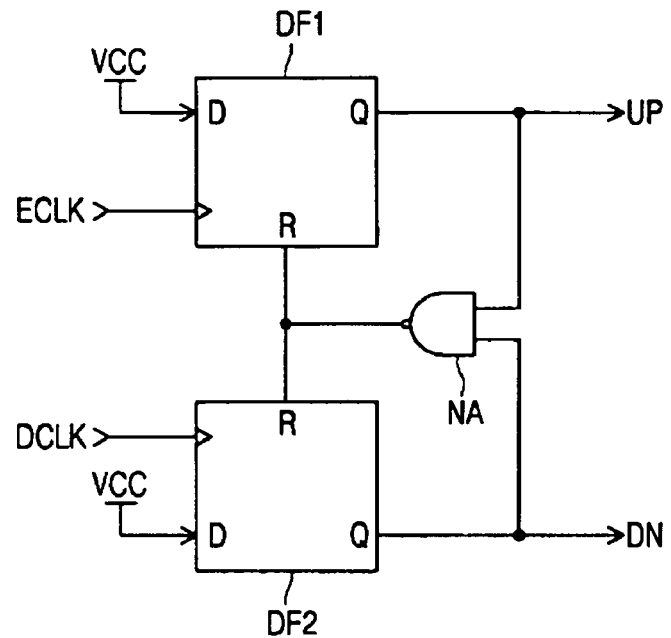
FIG. 14A illustrates a phase detector in accordance with an example embodiment of the present invention.

FIG. 14A illustrates an example of a phase detector of FIG. 4, in accordance with an example embodiment of the present invention. As shown, the phase detector may include one or more flip-flops, for example, D flip-flops, DF1 and DF2, and a NAND gate NA.

As shown, D flip-flop DF1 may receive ECLK as its clock signal, D flip-flop DF2 may receive DCLK as its clock signal, and both D flip-flop DF1 and DF2 may receive Vcc as an input signal. An output of D flip-flop DF1 may be the UP control signal and an output of D flip-flop DF2 may be the DN control signal. The UP and DN control signals may be NANDed by NAND gate NA and returned to D flip-flops DF1 and DF2.

The phase detector of FIG. 14A may measure a phase difference between an external clock ECLK and a feedback clock DCLK and may generate UP or DN control signals to a charge pump (for example, charge pump (CP) 12 of FIG. 4), in order to charge and discharge a loop filter (for example, loop filter (LF) 14 of FIG. 4). A loop filter provides a control voltage (Vc) to a VCO, in response to UP or DN control signal, as shown, for example, in FIG. 4.

Figure 14B:
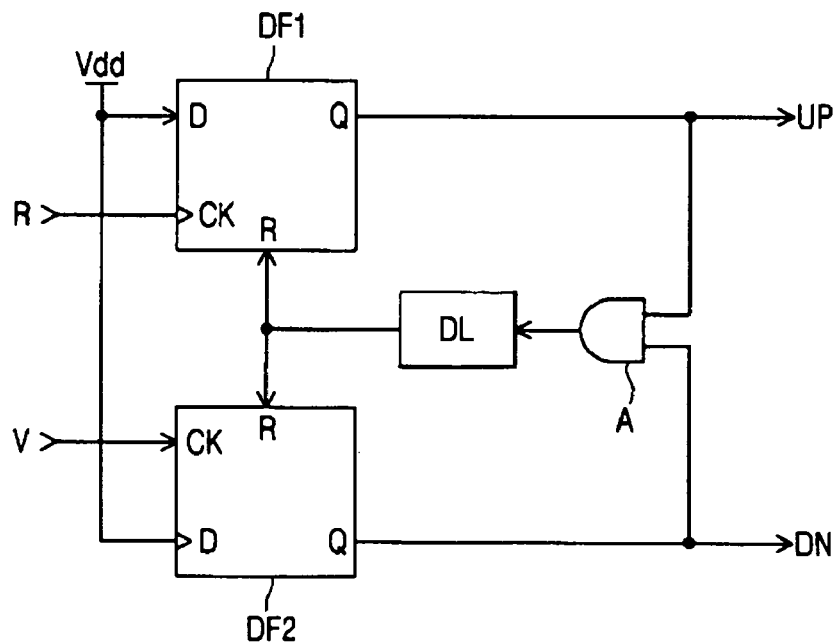
FIG. 14B illustrates a phase detector in accordance with another example embodiment of the present invention.

FIG. 14B illustrates an example of a phase detector 10 of FIG. 4, in accordance with another example embodiment of the present invention. As shown, the phase detector may include one or more flip-flops, for example, D flip-flops, DF1 and DF2, an AND gate A, and a delay DL.

As shown, D flip-flop DF1 may receive a reference clock R as its clock signal, D flip-flop DF2 may receive a feedback clock V as its clock signal, and both D flip-flop DF1 and DF2 may receive Vdd as an input signal. An output of D flip-flop DF1 may be the UP control signal and an output of D flip-flop DF2 may be the DN control signal. The UP and DN control signals may be ANDed by AND gate A, delayed by delay DL, and returned to D flip-flops DF1 and DF2.

Figure 14C:
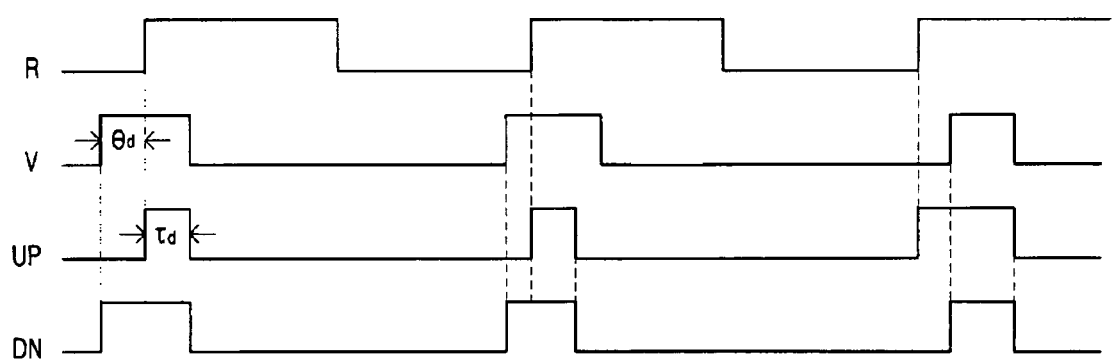
FIG. 14C is a timing diagram illustrating operation of the phase detector of FIG. 14B in accordance with an example embodiment of the present invention.

FIG. 14C is a timing diagram illustrating operation of the phase detector of FIG. 14B in accordance with an example embodiment of the present invention. As shown, the phase detector measures the phase offset $\Theta_d$ between reference clock R and feedback clock V and generates a control signal $T_d$ corresponding to the phase offset $\Theta_d$ for phase locking.

Figure 15A:
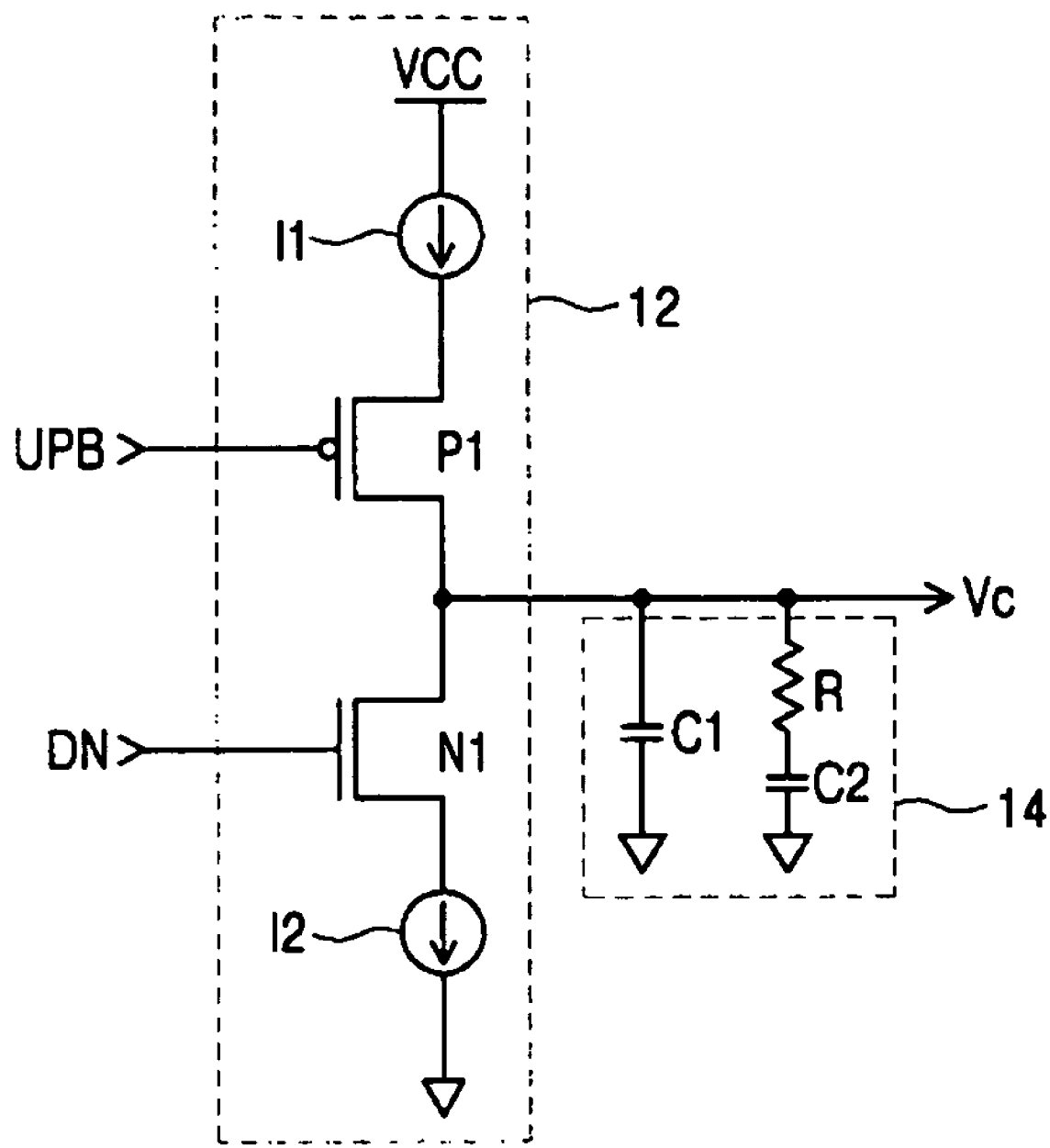
FIG. 15A illustrates a charge pump and a loop filter in accordance with an example embodiment of the present invention.

FIG. 15A illustrates an example of a charge pump and a loop filter, for example, charge pump (CP) 12 and loop filter (LF) 14 of FIG. 4, in accordance with an example embodiment of the present invention. As shown, the charge pump (CP) 12 may include one or more transistors, for example, P1 and N1, and the loop filter (LF) 14 may include one or more capacitors and/or resistors, C1, C2, and R.

As shown, P1 may be connected to VCC by first current source I1 and may be controlled by an inverse of the UP control signal UPB. N1 may be connected to ground by second current source I2 and may be controlled by the DN control signal. A control voltage Vc, output from the charge pump (CP) 12, may be supplied to C1 and R/C2 in parallel. As shown, R and C2 may be arranged in series.

Figure 15B:
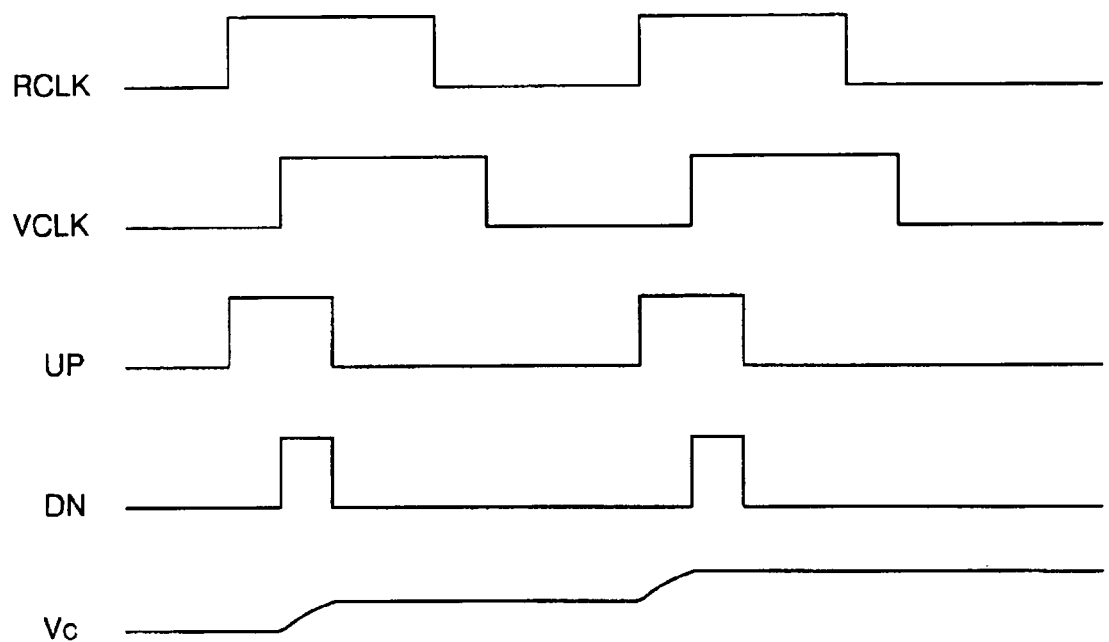
FIG. 15B is a timing diagram illustrating operation of the charge pump and a loop filter of FIG. 15A in accordance with an example embodiment of the present invention.

In example operation, as shown, for example, in FIG. 15B, if a reference clock signal (RCLK) leads a feedback clock signal (VCLK) from a VCO (for example, any of the VCOs shown in FIGS. 1A, 1B, 2, 4, 5A, 6A, 8A, 10, or 12 above), an UP control signal may be output to the charge pump (CP) 12. The charge pump (CP) 12 may charge the loop filter (LF) 14 so that a voltage level of the control voltage Vc is increased (for example, gradually) until a locking operation is completed in the phase locked loop. In an example embodiment, the loop filter 14 is a low pass filter.

Figure 15C:
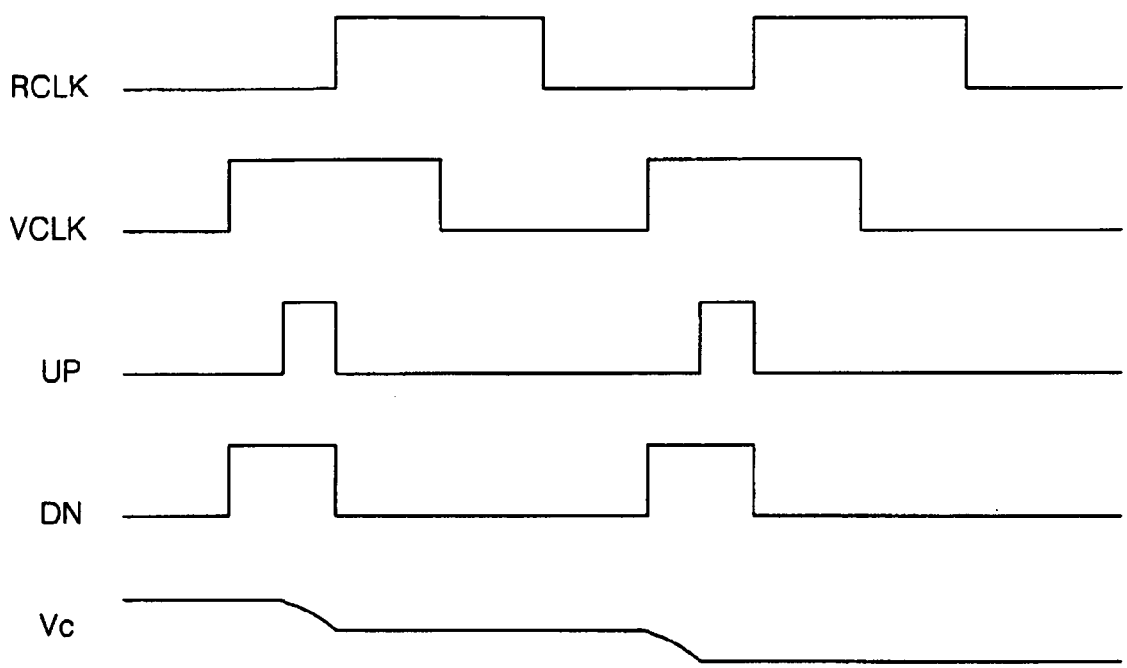
FIG. 15C is a timing diagram illustrating operation of the charge pump and a loop filter of FIG. 15A in accordance with another example embodiment of the present invention.

In example operation, as shown, for example, in FIG. 15C, if the reference clock signal (RCLK) lags the feedback clock signal (VCLK) of VCO, a DN control signal may be output to the charge pump (CP) 12. The charge pump (CP) 12 may charge the loop filter (LF) 14 so that a voltage level of the control voltage Vc is decreased (for example, gradually) until a locking operation is completed in the phase locked loop.

Figure 16A:
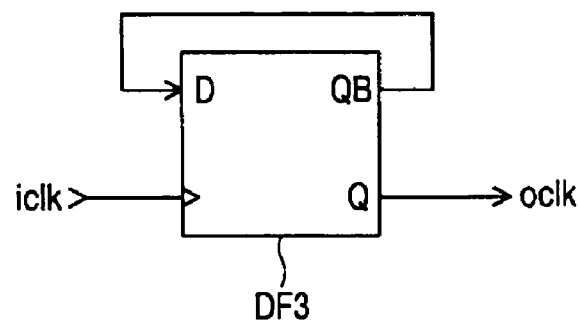
FIG. 16A illustrates a divider in accordance with an example embodiment of the present invention.
Figure 16B:
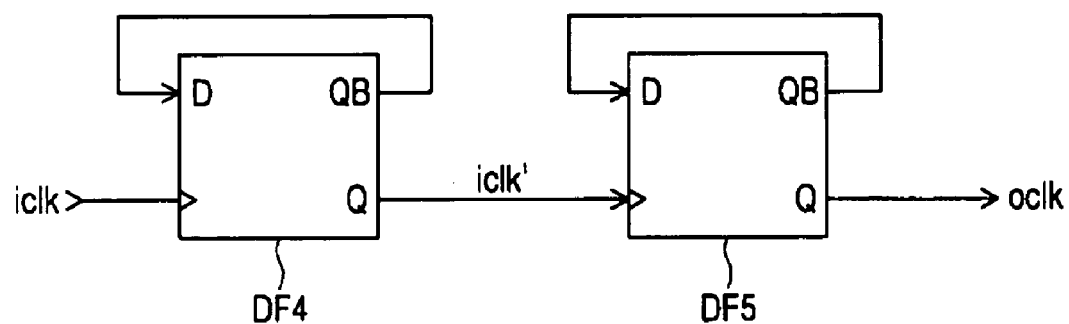
FIG. 16B illustrates a divider in accordance with another example embodiment of the present invention.

FIGS. 16A and 16B illustrate examples of a divider for example, divider 20 of FIG. 4, in accordance with an example embodiment of the present invention. As shown, the divider may include one or more one or more flip-flops, for example, D flip-flops, DF3, DF4, and/or DF5.

As shown in FIG. 16A, D flip-flop DF3 may receive one or more internal clock signals iclk (for example, any one of internal clocks ICLK0~ICLKn of FIG. 4) as its clock signal, its own output QB as an input signal, and output clock signal oclk as a feedback clock signal (for example, feedback clock signal DCLK of FIG. 4). In the example embodiment of FIG. 16A, the divider is a "divide by 2" divider. For example, if the internal clock signal iclk has a frequency of 2 GHz, the output clock signal oclk has a frequency of 1 GHz.

As shown in FIG. 16B, D flip-flops DF4 and D5 may be arranged in series. D flip-flop DF4 may receive one or more internal clock signals iclk (for example, any one of internal clocks ICLK0~ICLKn of FIG. 4) as its clock signal, its own output QB as an input signal, and output clock signal iclk' as an output clock signal. Similarly, D flip-flop DF5 may receive the clock signal iclk' as its clock signal, its own output QB as an input signal, and output clock signal oclk as a feedback clock signal (for example, feedback clock signal DCLK of FIG. 4). In the example embodiment of FIG. 16B, the divider is a "divide by 4" divider. For example, if the internal clock signal iclk has a frequency of 4 GHz, the clock signal iclk' has a frequency of 2 GHz, and the output clock signal oclk has a frequency of 1 GHz.

Figure 17:
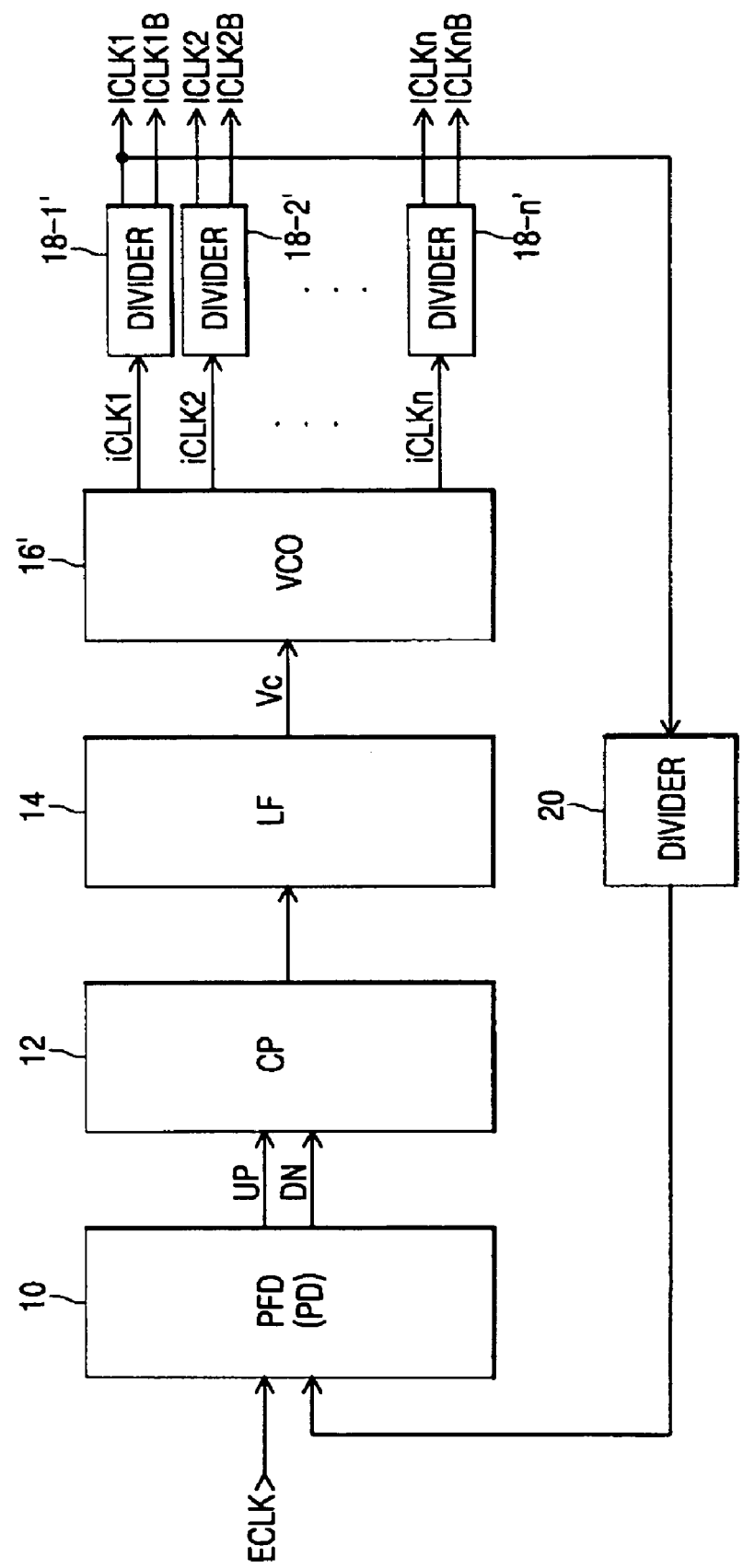
FIG. 17 illustrates a phase locked loop in accordance with another example embodiment of the present invention.

FIG. 17 illustrates a phase locked loop in accordance with another example embodiment of the present invention, which may include a phase frequency detector (PFD) 10, a charge pump (CP) 12, a loop filter (LF) 14, a voltage controlled oscillator (VCO) 16', one or more dividers 18-1', 18-2', and/or one or more dividers 20. The VCO 16' may directly generate a plurality of even higher frequency internal clock signals (for example, 4 GHz or more) corresponding to internal clock signals ICLK0~ICLK270 of FIG. 1A, with relatively few dividers, and even though a power supply voltage VDD is relatively low (for example, less than 2V). In an example embodiment, the one or more dividers 18-1', 18-2' may generate a plurality of higher frequency internal clock signals ICLK1, ICLK1B, ICLK2, ICLK2B, . . . , ICLKn, ICLKnB (for example, 2 GHz or more) even though a power supply voltage VDD is relatively low (for example, less than 2V).

In an example embodiment, the VCO 16' may be implemented with hyper ring oscillator, which may directly generate a plurality of internal clock signals (for example, four clock signals or more) which have a regular phase difference.

It is noted that each of the alternatives and variations discussed above with respect to the phase locked loops of FIGS. 4-13, are also applicable to the phase locked loop of FIG. 17.

Figure 18:
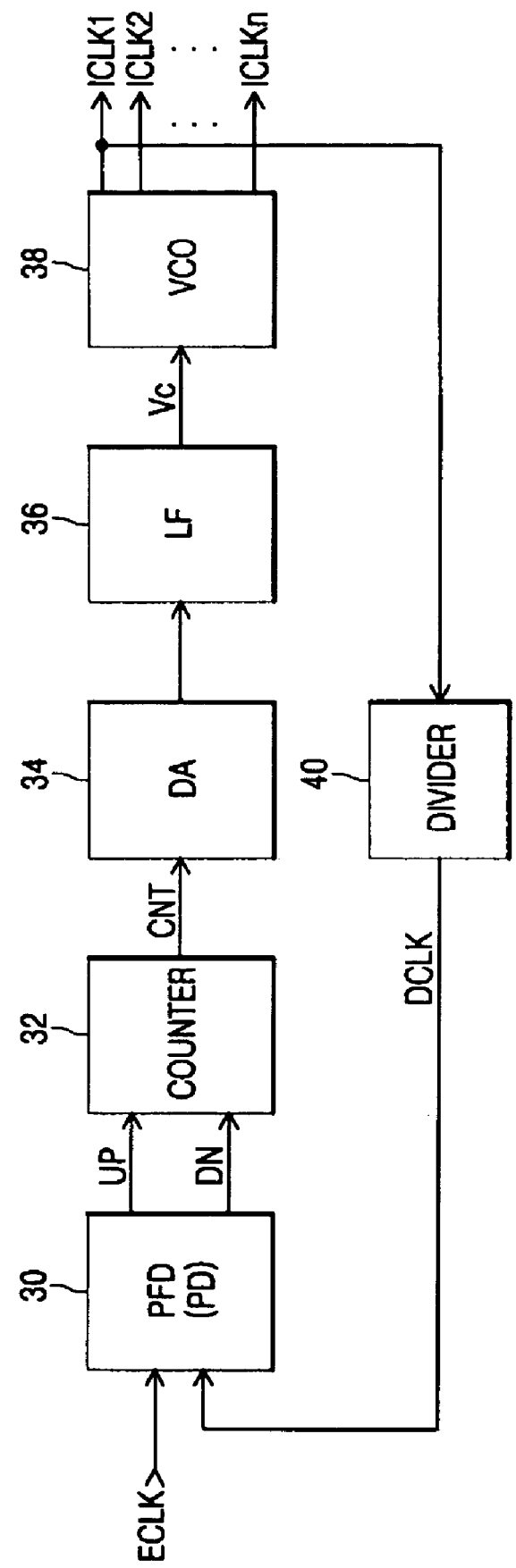
FIG. 18 illustrates a phase locked loop in accordance with another example embodiment of the present invention.

Although example embodiments of the present invention have been illustrated in the context of an analog phase locked loop, as shown for example, in FIGS. 4 and 17, one or more concepts of the present invention may also be applied to digital phase locked loop, as shown in FIG. 18. FIG. 18 illustrates a phase locked loop in accordance with another example embodiment of the present invention, which may include a phase frequency detector (PFD) 10, a counter 32, a digital-to-analog converter (DA) 34, a loop filter (LF) 36, a voltage controlled oscillator (VCO) 38, and/or one or more dividers 40.

The VCO 38 may directly generate a plurality of higher frequency internal clock signals (for example, 2 GHz or more) corresponding to internal clock signals ICLK0~ICLK270 of FIG. 1A even though a power supply voltage VDD is relatively low (for example, less than 2V). In an example embodiment, the VCO 38 may be implemented with a hyper ring oscillator, which may generate directly a plurality of internal clock signals (for example, four clock signals or more) which have a regular phase difference. In addition, a VCO in accordance with an example embodiment of the present invention. for example VCO 38, may have a reduced chip area because dividers, for example, dividers 18-1, 18-2, are not needed.

As shown, the counter 32 may be controlled to conduct up or down counting in response to UP or DN control signal so that the value of a counting output signal (CNT) composed of a plurality of bits is increased or decreased. For example, "1110..000" may be increased to "1111..000" upon receipt of the UP signal or "1110..000" may be decreased to "1100-000" upon receipt of the DN signal.

Figure 19:
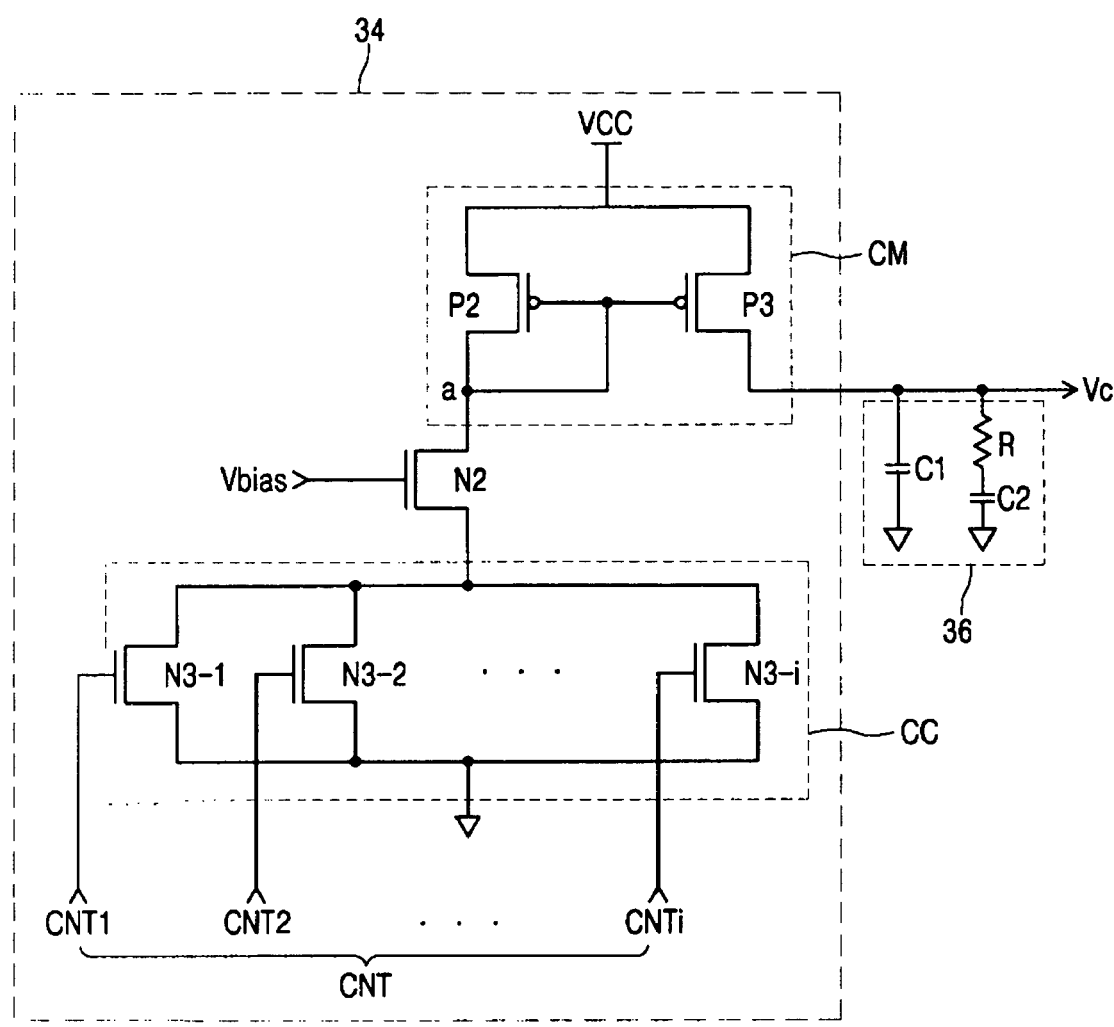
FIG. 19 illustrates a digital-to-analog converter and a loop filter in accordance with an example embodiment of the present invention.

FIG. 19 illustrates an example of a digital-to-analog converter and a loop filter, for example, digital-to-analog converter (DA) 34, a loop filter (LF) 36 of FIG. 18, in accordance with an example embodiment of the present invention. As shown, the digital-to-analog converter (DA) 34 may include a first circuit CM including one or more transistors, for example, P2 and P3, a second circuit CC including one or more transistors, for example, N3-1, . . . N3-i (where i is the number of bits in the counting output signal (CNT)), and one or more transistors, for example, bias transistor N2.

As shown and described above with respect to FIG. 15 and loop filter (LF) 14, loop filter (LF) 36 may include one or more capacitors and/or resistors, C1, C2, and R. A control voltage Vc, output from the digital-to-analog converter (DA) 34, may be supplied to C1 and R/C2 in parallel. As shown, R and C2 may be arranged in series.

The value of Vbias supplied to N2 maintains a desired voltage (for example, one half VCC).

In operation, if a value of the counting output signal (CNT) composed of a plurality of bits is all high (111..11), all transistors (N3-1~N3-i) may be turned on so that a voltage of node a is at its lowest level. In this state, a control voltage Vc is increased to its highest level.

Conversely, if the value of CNT is composed of 1000..00, all transistors (N3-2~N3-i) except N3-1 may be turned off so that the value of node a is at its highest level. In this state, the control voltage Vc is decreased to its lowest level. As shown above, the value of Vc may be adjusted by the counting output signal CNT.

It is noted that each of the alternatives and variations discussed above with respect to the analog phase locked loops of FIGS. 4-17, are also applicable, to the extent feasible, to the digital phase locked loop of FIG. 18.

Figure 20:
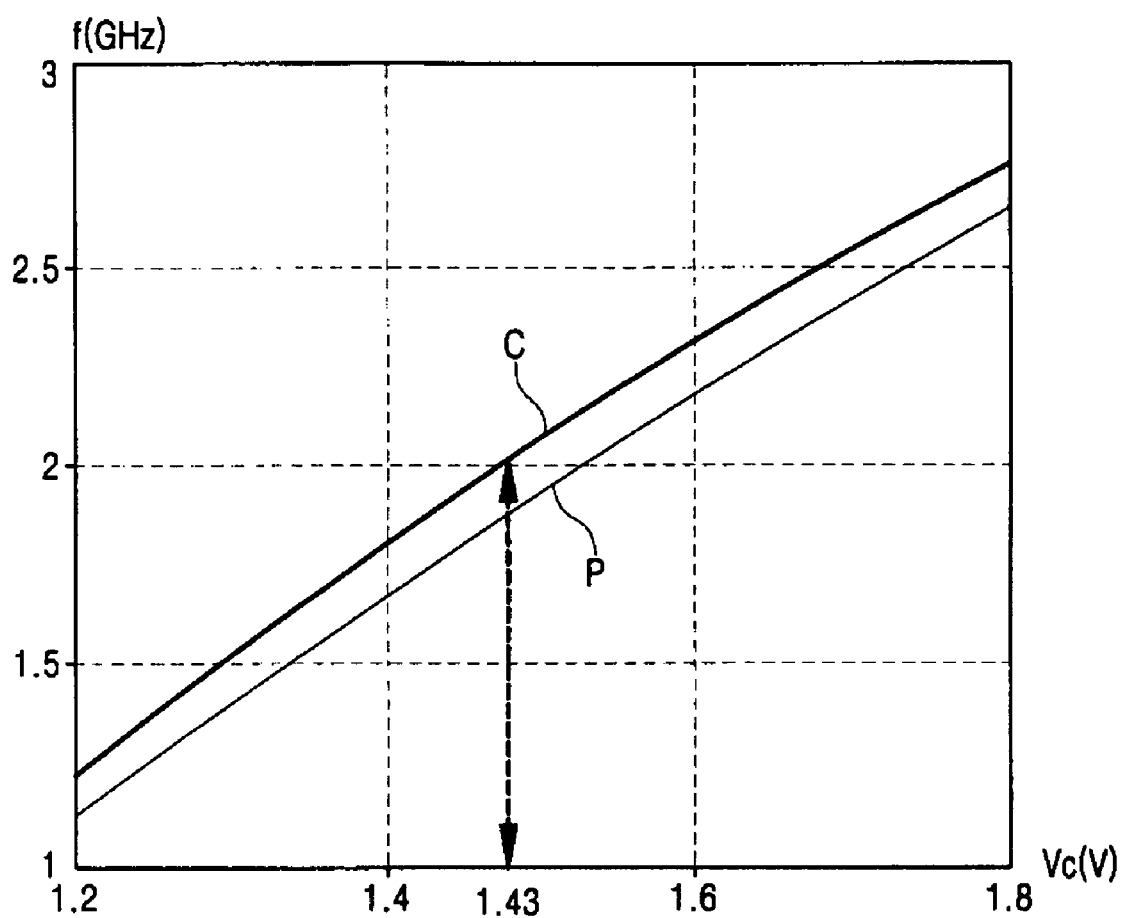
FIG. 20 illustrates a simulation of frequency variation of a voltage controlled oscillator in accordance with an example embodiment of the present invention compared to frequency variation of a conventional voltage controlled oscillator.

FIG. 20 illustrates a simulation of frequency variation (C) of a voltage controlled oscillator in accordance with an example embodiment of the present invention compared to frequency variation (P) of a conventional voltage controlled oscillator. As shown in FIG. 20, 2 GHz internal clocks (for example, ICLK0, ICLK90, ICLK180, ICLK270 of FIG. 4) may be directly generated from a VCO in accordance with an example embodiment of the present invention when a control voltage Vc is 1.43V. However, in order to generate 2 GHz internal clocks in a conventional PLL, a conventional VCO must output 4 GHz clock signals (for example CLK, CLKB of FIG. 1A), which requires a control voltage Vc of well over 1.8V. Therefore, it is difficult to output higher frequency internal clock signals in a low power semiconductor device (under 1.8V), using a conventional PLL with a conventional VCO.

Figure 21:
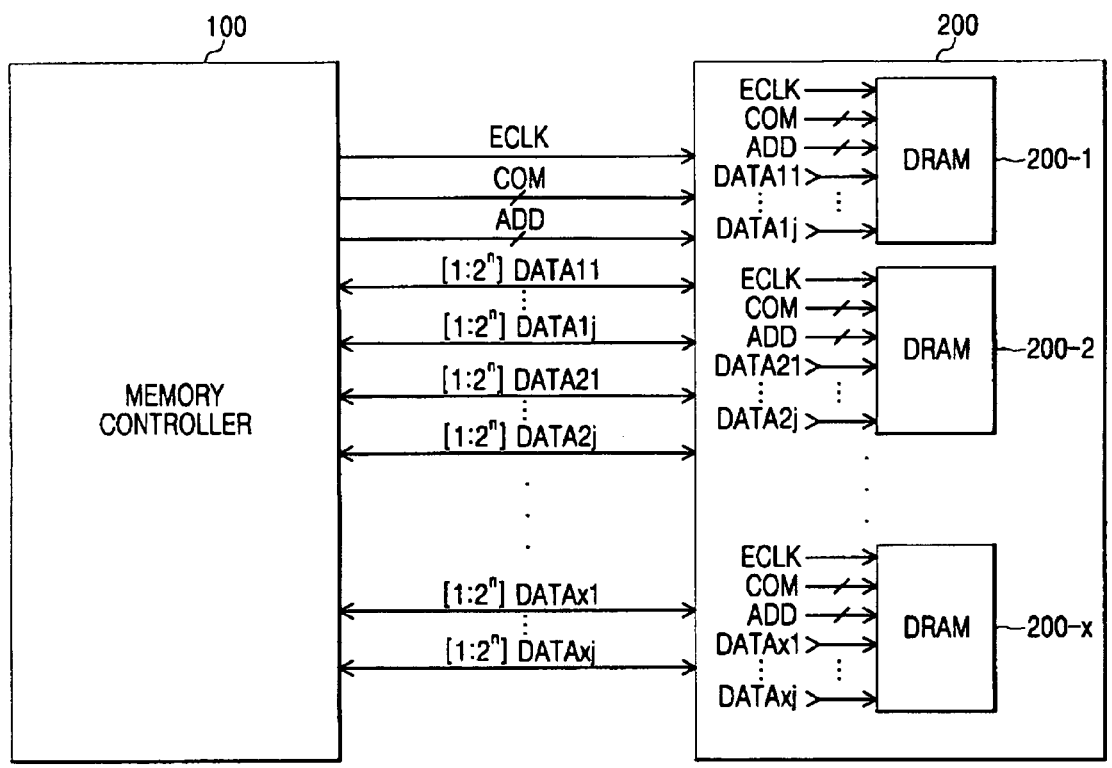
FIG. 21 illustrates a memory system including a phase locked loop in accordance with an example embodiment of the present invention.
Figure 22:
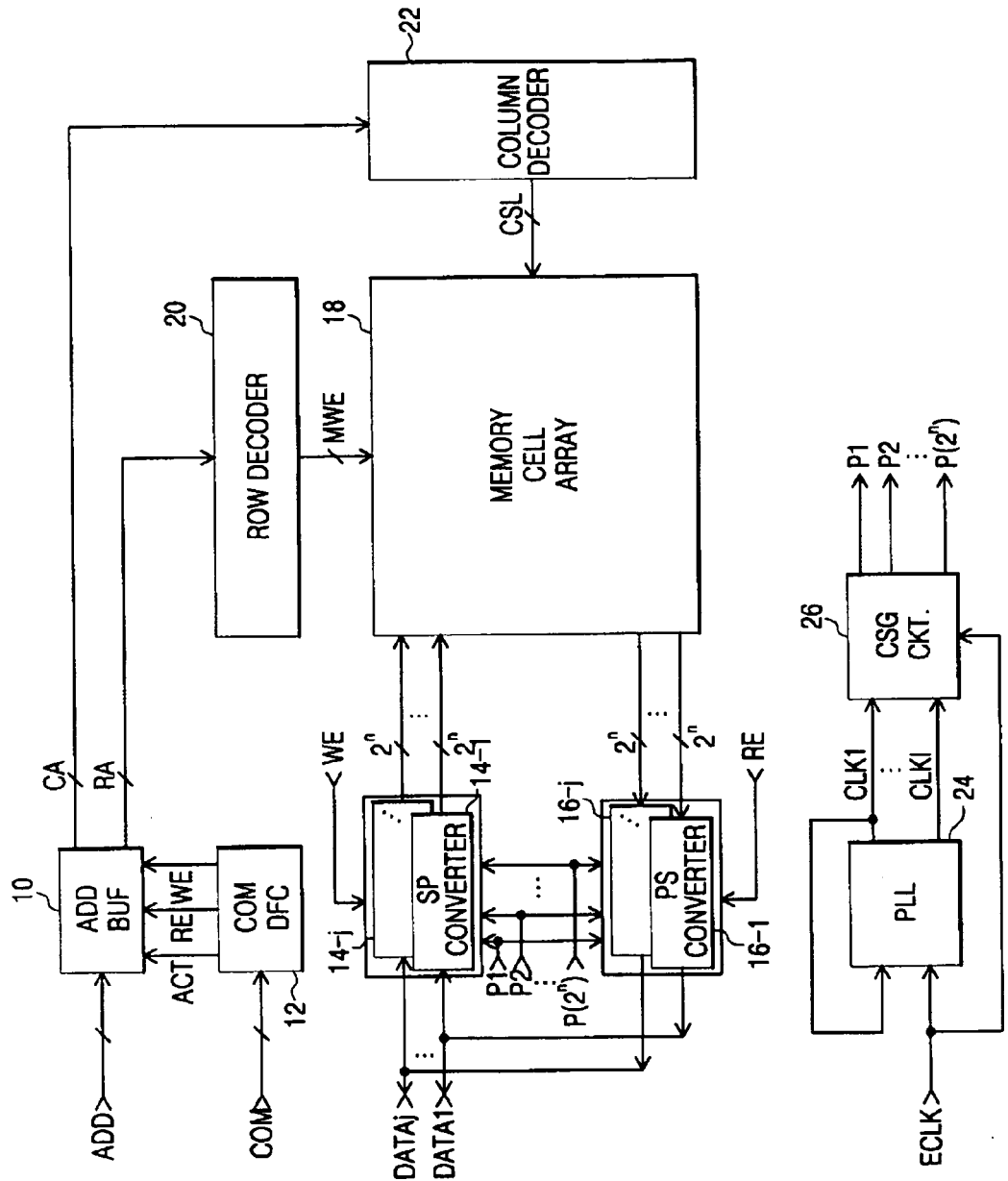
FIG. 22 illustrates a memory device including a phase locked loop in accordance with an example embodiment of the present invention.

FIG. 21 illustrates an example of a memory system and FIG. 22 illustrates an example of a memory device, for example the memory device 200-1 of FIG. 21, including associated control logic, in accordance with an example embodiment of the present invention. More particularly, the memory module 200 of FIGS. 21 and 22 may include one or more of the phase locked loops described above in conjunction with FIGS. 4-19 as phase locked loop 24.

As shown, a memory system in accordance with an example embodiment of the present invention may include a memory controller 100 and a memory module 200. The memory module 200 may further include a plurality of memory devices 200-1, 200-2, 200-x, which may be implemented, for example, by DRAMs.

The memory controller 100 may output an external clock signal ECLK, one or more command signals COM, one or more address signals ADD, and/or one or more data signals DATA to the memory module 200.

The memory module 200 may also output one or more data signals DATA to the memory controller 100. In the example shown in FIG. 21, the one or more data signals DATA may be composed of a serial stream of $2^n$ bits, represented by [1:$2^n$] DATA11 to [1:$2^n$] DATAxj. As shown in FIG. 21, memory device 200-1 may receive the external clock signal ECLK, the one or more command signals COM, the one or more address signals ADD, and the DATA signals DATA 11 to DATA 1j. Similarly, memory device 200-2 may receive the external clock signal ECLK, the one or more command signals COM, the one or more external address signals ADD, and the DATA signals DATA 21 to DATA 2j, and memory device 200-x may receive the external clock signal ECLK, the one or more command signals COM, the one or more address signals ADD, and the DATA signals DATA x1 to DATA xj.

As shown, in the example memory system of FIG. 21, each memory device 200-1, 200-2, 200-x may receive or output DATA composed of serial $2^n$ bits during one clock cycle of the external clock signal ECLK. In addition, DATA of j bits may be written or read at the same time.

As shown in FIG. 22, the associated control logic may include an address buffer (ADD BUF) 10, a command decoder (COM DEC) 12, one or more serial-to-parallel converters 14-1 to 14-j (j corresponding to the j in FIG. 1A), one or more parallel-to-serial converters 16-1 to 16-j, the memory cell array 18, a row decoder 20, a column decoder 22, a PLL 24, and/or a control signal generation circuit (CSG Ckt.) 26 The address buffer (ADD BUF) 10 may receive one or more external input addresses (ADD) to generate a row address (RA), supplied to the row decoder 20, in response to an active command signal (ACT).

The row decoder 20 may activate a main word line enable signal (MWE) corresponding to a plurality of row addresses generated from a plurality of row address buffers so that a desired word line (not shown) may be selected in the memory cell array 18. The address buffer (ADD BUF) 10 may also generate a column address (CA), supplied to the column decoder 22, in response to a read command (RE) or a write command (WE) decoded from the one or more command signals COM.

The column decoder 22 may receive a plurality of column addresses to activate a corresponding column select line (CSL). A plurality of bit lines of the memory cell array 18 may be selected in response to the selected CSL so that a plurality of data may be written to or read from the selected memory cells.

As set forth above, the command decoder 12 may generate an active command, a read command and a write command after receiving a plurality of external command signals (COM), for example, RASB, CASB, WEB etc.

Each serial-to-parallel converter (14-1 to 14-j) may receive serial data DATA composed of $2^n$ bit data and output $2^n$ bit parallel data through $2^n$ data bus lines simultaneously to the memory cell array 18, in response to a write command signal (WE) and a plurality of control signals (P1~P($2^n$)). If the number of data input/data output pins (DQ) is j, the number of serial-to-parallel converter is also j. In addition, each of the serial-to-parallel converters (14-1 to 14-j) may be coupled to the memory cell array 18 via $2^n$ data bus lines.

Each parallel-to-serial converter (16-1 to 16-j) may receive $2^n$ bit data from a memory cell array 18 in parallel and output $2^n$ bit serial data responsive to a read command signal (RE) and the plurality of control signals (P1~P($2^n$)). If the number of data input/data output pins (DQ) is j, the number of parallel-to-serial converters is also j.

The phase lock loop 24 may receive the external clock signal ECLK and perform a locking operation to output an internal clock signal CLK1, which is locked with ECLK. After completing the locking operation, the phase lock loop 24 may output a plurality of internal clock signals (CLK1~CLKI) to the control signal generation circuit (CSG Ckt.) 26. The control signal generation circuit (CSG Ckt.) 26 may generate the plurality of control signals (P1~P($2^n$)).

It will be apparent to those skilled in the art that other changes and modifications may be made in the above-described example embodiments without departing from the scope of the invention herein, and it is intended that all matter contained in the above description shall be interpreted in an illustrative and not a limiting sense.

What is claimed is:

1. A phase locked loop circuit, comprising:
   a phase detector receiving an external clock signal and a feedback clock signal and outputting an up signal when a phase of the external clock signal leads a phase of the feedback clock signal and outputting a down signal when the phase of the external clock signal lags the phase of the feedback clock signal;
   a loop filter circuit increasing a control voltage in response to the up signal and decreasing the control voltage in response to the down signal; and
   a voltage controlled oscillator circuit receiving the control voltage and directly generating at least n (where n is an integer $\geq 4$) internal clock signals,
   wherein the voltage controlled oscillator circuit includes a hyper-ring oscillator, a frequency of the n internal clock signals is a multiple of a frequency of the external clock signal without using a divider and the n internal clock signals have different phases from one another and have the same phase difference and at least one of the n internal clock signals is used to generate the feedback clock signal and the feedback clock signal is locked with the external clock signal, and wherein the hyper-ring oscillator comprises at least two loops connecting inverting circuits as a ring-type, at least one of the inverting circuits is commonly connected to the at least two loops, and at least one of the n internal clock signals is generated by combining phases of output signals of at least two of the inverting circuits.

2. The phase locked loop circuit of claim 1, further comprising:
   a divider, dividing a frequency of the at least one of the n internal clock signals to generate the feedback clock signal.

3. The phase locked loop circuit of claim 2, the divider including at least one D flip-flop.

4. The phase locked loop circuit of claim 1, wherein the loop filter circuit is an analog loop filter circuit.

5. The phase locked loop circuit of claim 4, wherein the loop filter circuit includes a charge pump and a low pass-filter, the charge pump charging or discharging the low pass filter to control a level of the control voltage until a locking operation is completed in the phase locked loop circuit.

6. The phase locked loop circuit of claim 1, wherein the voltage controlled oscillator circuit generates output signals of the inverting circuits as the n internal clock signals.

7. The phase locked loop circuit of claim 6, wherein when n=4, two of the inverting circuits receive (n/2) inputs and the other two of the inverting circuits receive (n/2)−1 input.

8. The phase locked loop circuit of claim 6, wherein when n is an even number greater than four, each of the inverting circuits receives (n/2) inputs.

9. The phase locked loop circuit of claim 6, wherein when n is an odd number greater than four, each of the inverting circuits receives (n−1)/2 inputs.

10. The phase locked loop circuit of claim 6, wherein when n is an even number greater than four, the inverting circuits are n*(n/2) inverters.

11. The phase locked loop circuit of claim 6, wherein when n is an odd number greater than four, the inverting circuits are n*((n−1)/2) inverters.

12. The phase locked loop circuit of claim 6, wherein a phase of each of the n internal clock signals differs by 360/n.

13. The phase locked loop circuit of claim 8, wherein when n=4, the inverting circuits include four nodes, six inverters, and at least three loop circuits.

14. The phase locked loop circuit of claim 8, wherein when n=4, the inverting circuits include 4 nodes, eight inverters, and at least seven loop circuits.

15. The phase locked loop circuit of claim 8, wherein when n=5, the inverting circuits include 5 nodes, ten inverters, and at least eight loop circuits.

16. The phase locked loop circuit of claim 8, wherein when n=6, the inverting circuits include six nodes, 18 inverters, and at least eight loop circuits.

17. The phase locked loop circuit of claim 8, wherein when n=8, the inverting circuits include 8 nodes, 32 inverters, and at least eight loop circuits.

18. The phase locked loop circuit of claim 1, wherein the voltage controlled oscillator circuit generates m*n internal clock signals (where m is an integer $\geq 2$), a frequency of the m*n internal clock signals is a multiple of a frequency of the external clock signal and wherein at least one of the m*n internal clock signals is used to generate the feedback clock signal.

19. The phase locked loop circuit of claim 18, the voltage controlled oscillator circuit further including:
 a voltage controlled oscillator receiving the control voltage and generating n intermediate internal clock signals, and
 n dividers, dividing the n intermediate internal clock signals into the m*n internal clock signals.

20. The phase locked loop circuit of claim 19, wherein a frequency of the m*n internal clock signals is a multiple of a frequency of the external clock signal, a frequency of the n intermediate internal clock signals is a multiple of the frequency of the external clock signal, and a frequency of the n intermediate internal clock signals is a multiple of the frequency of the m*n internal clock signals.

21. A phase locked loop circuit, comprising:
 a phase detector receiving an external clock signal and a feedback clock signal and outputting an up signal when a phase of the external clock signal leads a phase of the feedback clock signal and outputting a down signal when the phase of the external clock signal lags the phase of the feedback clock signal;
 a loop filter circuit increasing a control voltage in response to the up signal and decreasing the control voltage in response to the down signal, and including a counter, a digital-to-analog converter and a loop filter, the counter counting up in response to the up signal and counting down in response to the down signal to control a level of the control voltage until a locking operation is completed in the phase locked loop circuit; and
 a voltage controlled oscillator circuit receiving the control voltage and directly generating at least n (where n is an integer $\geq 4$) internal clock signals,
 wherein the voltage controlled oscillator circuit includes a hyper-ring oscillator, a frequency of the n internal clock signals is a multiple of a frequency of the external clock signal without using a divider, the internal clock signals have different phases from one another and have the same phase difference, at least one of the n internal clock signals is used to generate the feedback clock signal and the feedback clock signal is locked with the external clock signal, and wherein the hyper-ring oscillator comprises at least two loops connecting inverting circuits as a ring-type, at least one of the inverting circuits is commonly connected to the at least two loops, and at least one of the n internal clock signals is generated by combining phases of output signals of at least two of the inverting circuits.

22. The phase locked loop circuit of claim 21, wherein the voltage controlled oscillator circuit generates m*n internal clock signals (where m is an integer $\geq 2$), a frequency of the m*n internal clock signals is a multiple of a frequency of the external clock signal and wherein at least one of the m*n internal clock signals is used to generate the feedback clock signal.

23. The phase locked loop circuit of claim 22, the voltage controlled oscillator circuit further including:
 a voltage controlled oscillator receiving the control voltage and generating n intermediate internal clock signals, and
 n dividers, dividing the n intermediate internal clock signals into the m*n internal clock signals.

24. The phase locked loop circuit of claim 23, wherein a frequency of the m*n internal clock signals is a multiple of a frequency of the external clock signal, a frequency of the n intermediate internal clock signals is a multiple of the frequency of the external clock signal, and a frequency of the n intermediate internal clock signals is a multiple of the frequency of the m*n internal clock signals.

25. The phase locked loop circuit of claim 1, wherein the voltage controlled oscillator circuit does not include a divider.

26. A method of locking the phase of a feedback clock signal to an external clock signal, comprising:
 receiving the external clock signal and the feedback clock signal;
 outputting an up signal when a phase of the external clock signal leads a phase of the feedback clock signal and outputting a down signal when the phase of the external clock signal lags the phase of the feedback clock signal;
 increasing a control voltage in response to the up signal and decreasing the control voltage in response to the down signal; and
 directly generating at least n (where n is an integer $\geq 4$) internal clock signals; and
 generating the feedback clock signal from at least one of the n internal clock signals,
 wherein a frequency of the n internal clock signals is a multiple of a frequency of the external clock signal without using a divider and the internal clock signals have different phases from one another and have the same phase difference, at least one of the n internal clock signals is used to generate the feedback clock signal and the feedback clock signal is locked with the external clock signal, and wherein the n internal clock signals are generated by using the hyper-ring oscillator comprising at least two loops connecting inverting circuits as a ring-type, at least one of the inverting circuits is commonly connected to the at least two loops, and at least one of the n internal clock signals is generated by combining phases of output signals of at least two of the inverting circuits.

27. A phase locked loop circuit, comprising:

a phase detector receiving an external clock signal and a feedback clock signal and outputting an up signal when a phase of the external clock signal leads a phase of the feedback clock signal and outputting a down signal when the phase of the external clock signal lags the phase of the feedback clock signal;

a loop filter circuit increasing a control voltage in response to the up signal and decreasing the control voltage in response to the down signal; and a voltage controlled oscillator circuit, including at least four loops, receiving the control voltage and generating multiple internal clock signals, wherein the voltage controlled oscillator circuit includes a hyper-ring oscillator, a frequency of the multiple internal clock signals is a multiple of a frequency of the external clock signal without using a divider, the multiple clock signals have different phases from one another and have the same phase difference, at least one of the multiple internal clock signals is used to generate the feedback clock signal and the feedback clock signal is locked with the external clock signal, and wherein the four loops are connected inverting circuits as a ring-type, at least one of the multiple inverting circuits is commonly connected to the at least two loops, and at least one of the multiple internal clock signals is generated by combining phases of output signals of at least two of the inverting circuits.

* * * * *